(12) United States Patent
Zediker et al.

(10) Patent No.: US 11,811,196 B2
(45) Date of Patent: Nov. 7, 2023

(54) APPLICATIONS, METHODS AND SYSTEMS FOR A LASER DELIVER ADDRESSABLE ARRAY

(71) Applicant: Nuburu, Inc., Centennial, CO (US)

(72) Inventors: Mark S. Zediker, Castle Rock, CO (US); Matthew Silva Sa, Englewood, CO (US); Jean Michel Pelaprat, Saratoga, CA (US); David Hill, Broomfield, CO (US); Mathew Finuf, Castle Rock, CO (US)

(73) Assignee: Nuburu, Inc., Centennial, CO (US)

( * ) Notice: Subject to any disclaimer, the term of this patent is extended or adjusted under 35 U.S.C. 154(b) by 0 days.

(21) Appl. No.: 17/222,561

(22) Filed: Apr. 5, 2021

(65) Prior Publication Data

US 2022/0021183 A1   Jan. 20, 2022

Related U.S. Application Data

(60) Division of application No. 15/210,765, filed on Jul. 14, 2016, now Pat. No. 10,971,896, which is a
(Continued)

(51) Int. Cl.
*H01S 5/14*         (2006.01)
*H01S 5/40*         (2006.01)
*H01S 3/067*        (2006.01)
*H01S 5/00*         (2006.01)
*H01S 3/30*         (2006.01)
*G02B 27/09*        (2006.01)
*H01S 5/323*        (2006.01)
*H01S 5/024*        (2006.01)

(52) U.S. Cl.
CPC .......... *H01S 5/146* (2013.01); *G02B 27/0922* (2013.01); *H01S 3/067* (2013.01); *H01S 3/30* (2013.01); *H01S 3/302* (2013.01); *H01S 5/0092* (2013.01); *H01S 5/32341* (2013.01); *H01S 5/405* (2013.01); *H01S 5/4012* (2013.01); *H01S 5/4062* (2013.01); *H01S 5/02469* (2013.01); *H01S 5/4087* (2013.01)

(58) Field of Classification Search
CPC ......... B33Y 30/00; B33Y 10/00; H01S 3/302; H01S 5/0092; H01S 3/30; H01S 5/405
See application file for complete search history.

(56) References Cited

U.S. PATENT DOCUMENTS 5,837,960 A * 11/1998 Lewis .................. B23K 26/144
                                                219/121.64
6,861,613 B1 * 3/2005 Meiners ................ B29C 64/153
                                                219/121.84
(Continued)

FOREIGN PATENT DOCUMENTS

JP         2013233556 A  * 11/2013

*Primary Examiner* — Thien S Tran
(74) *Attorney, Agent, or Firm* — Glen P. Belvis; Belvis Law, LLC.

(57) ABSTRACT

There is provided assemblies for combining a group of laser sources into a combined laser beam. There is further provided a blue diode laser array that combines the laser beams from an assembly of blue laser diodes. There are provided laser processing operations and applications using the combined blue laser beams from the laser diode arrays and modules.

12 Claims, 23 Drawing Sheets

Related U.S. Application Data continuation-in-part of application No. 14/787,393, filed as application No. PCT/US2014/035928 on Apr. 29, 2014, now Pat. No. 10,940,536, said application No. 15/210,765 is a continuation-in-part of application No. 14/837,782, filed on Aug. 27, 2015, now Pat. No. 10,562,132, and a continuation-in-part of application No. PCT/US2014/035928, filed on Apr. 29, 2014.

(60) Provisional application No. 62/193,047, filed on Jul. 15, 2015, provisional application No. 62/329,660, filed on Apr. 29, 2016, provisional application No. 62/329,786, filed on Apr. 29, 2016, provisional application No. 62/329,830, filed on Apr. 29, 2016, provisional application No. 61/817,311, filed on Apr. 29, 2013, provisional application No. 62/042,785, filed on Aug. 27, 2014.

(56) References Cited

U.S. PATENT DOCUMENTS

| | | | |
|---|---|---|---|
| 2003/0091277 A1* | 5/2003 | Mei | G02B 6/04 385/33 |
| 2005/0038551 A1* | 2/2005 | Mazumder | B22F 12/90 219/121.63 |
| 2006/0169679 A1* | 8/2006 | Sato | B23K 26/34 219/121.64 |
| 2009/0190218 A1* | 7/2009 | Govorkov | G02B 19/0014 359/489.08 |
| 2011/0216792 A1* | 9/2011 | Chann | H01S 5/405 372/31 |

\* cited by examiner

| Parallel Processing System ||  |
|---|---:|---|
| Number of lasers | 20 | |
| Width per laser | 70 | um |
| Scan speed | 5 | m/sec |
| Powder depth | 70 | um |
|  |  |  |
| Build speed | 1764 | cc/hr |

FIG. 4

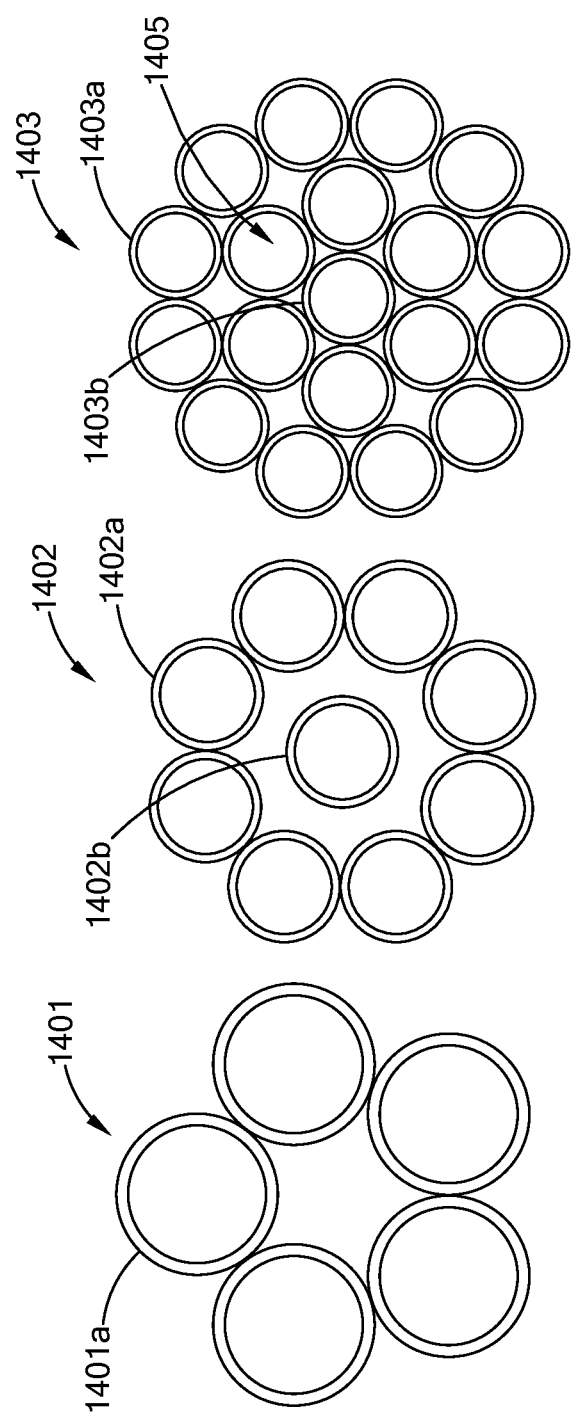

APPLICATIONS, METHODS AND SYSTEMS FOR A LASER DELIVER ADDRESSABLE ARRAY

This application is a divisional of U.S. patent application Ser. No. 15/210,765, filing date Jul. 14, 2016, which:

(i) claims under 35 U.S.C. § 119(e)(1) the benefit of U.S. provisional application Ser. No. 62/193,047, filing date Jul. 15, 2015;

(ii) claims under 35 U.S.C. § 119(e)(1) the benefit of U.S. provisional application Ser. No. 62/329,660, filing date Apr. 29, 2016;

(iii) claims under 35 U.S.C. § 119(e)(1) the benefit of U.S. provisional application Ser. No. 62/329,786, filing date Apr. 29, 2016;

(iv) claims under 35 U.S.C. § 119(e)(1) the benefit of U.S. provisional application Ser. No. 62/329,830, filing date Apr. 29, 2016;

(v) is a continuation-in-part of U.S. patent application Ser. No. 14/787,393, filed Oct. 27, 2015, which is a US nationalization pursuant to 35 U.S.C. § 371 of PCT/US2014/035928 filed Apr. 29, 2014, and which claims priority to U.S. provisional patent application Ser. No. 61/817,311, filed Apr. 29, 2013; and, (vi) is a continuation-in-part of U.S. patent application Ser. No. 14/837,782, filed Aug. 27, 2015, which claims under 35 U.S.C. § 119(e)(1), the benefit of the filing date of U.S. provisional application Ser. No. 62/042,785, filed Aug. 27, 2014, which claims under 35 U.S.C. § 119(e)(1), the benefit of the filing date of U.S. provisional application Ser. No. 62/193,047, filed Jul. 15, 2015, and, which is a continuation-in-part of PCT application serial PCT/US14/035928, which claims under 35 U.S.C. § 119(e)(1), the benefit of the filing date of U.S. provisional application 61/817,311, filed Apr. 29, 2013;

the entire disclosures of each of which is incorporated herein by reference.

BACKGROUND OF THE INVENTION

Field of the Invention

The present inventions relate to array assemblies for combining laser beams; and in particular array assemblies that can provide high brightness laser beams for use in systems and applications in manufacturing, fabricating, entertainment, graphics, imaging, analysis, monitoring, assembling, dental and medical fields.

Many lasers, and in particular semiconductor lasers, such as laser diodes, provide laser beams having highly desirable wavelengths and beam quality, including brightness. These lasers can have wavelengths in the visible range, UV range, IR range and combinations of these, as well as, higher and lower wavelengths. The art of semiconductor lasers, as well as other laser sources, e.g., fiber lasers, is rapidly evolving with new laser sources being continuously developed and providing existing and new laser wavelengths. While having desirable beam qualities, many of these lasers have lower laser powers than are desirable, or needed for particular applications. Thus, these lower powers have prevented these laser sources from finding greater utility and commercial applications.

Additionally, prior efforts to combine these types of laser have generally been inadequate, for among other reasons, difficulty in beam alignment, difficulty in keeping the beams aligned during applications, loss of beam quality, difficulty in the special placement of the laser sources, size considerations, and power management, to name a few.

As used herein, unless expressly stated otherwise, the terms "blue laser beams", "blue lasers" and "blue" should be given their broadest meaning, and in general refer to systems that provide laser beams, laser beams, laser sources, e.g., lasers and diodes lasers, that provide, e.g., propagate, a laser beam, or light having a wavelength from about 400 nm to about 500 nm.

Generally, the term "about" as used herein, unless specified otherwise, is meant to encompass a variance or range of ±10%, the experimental or instrument error associated with obtaining the stated value, and preferably the larger of these.

This Background of the Invention section is intended to introduce various aspects of the art, which may be associated with embodiments of the present inventions. Thus the forgoing discussion in this section provides a framework for better understanding the present inventions, and is not to be viewed as an admission of prior art.

SUMMARY

There has been a long-standing and unfulfilled need for, among other things, assemblies and systems to combine multiple laser beam sources into a single or number of laser beams, while maintaining and enhancing desired beam qualities, such as brightness and power. The present inventions, among other things, solve these needs by providing the articles of manufacture, devices and processes taught, and disclosed herein.

Thus, there is provided a laser system for performing laser operations, the system having: a plurality of laser diode assemblies; each laser diode assembly having a plurality of laser diodes capable of producing an individual blue laser beam along a laser beam path; a means for spatially combining the individual blue laser beams to make a combined laser beam having a single spot in the far-field that is capable of being coupled into a optical fiber for delivery to a target material; and, the means for spatially combining the individual blue laser beams on the laser beam path and in optical association with each laser diode.

Further there is provided the methods and systems having one or more of the following features: having at least three laser diode assemblies; and each laser diode assembly having at least 30 laser diodes; wherein the laser diode assemblies are capable of propagating laser beams having a total power of at least about 30 Watts, and a beam parameter property of less than 20 mm mrad; wherein the beam parameter property is less than 15 mm mrad; wherein the beam parameter property is less than 10 mm mrad; wherein the means for spatially combining produces a combined laser beam N times the brightness of the individual laser beam; wherein N is the number of laser diodes in the laser diode assembly; wherein the means for spatially combining increases the power of the laser beam while preserving the brightness of the combined laser beam; whereby the combined laser beam has a power that is at least 50× the power of the individual laser beam and whereby a beam parameter product of the combined laser beam is no greater than 2 times a beam parameter product of an individual laser beam; whereby the beam parameter product of the combined laser beam is no greater than 0.1.5 times the beam parameter product of the individual laser beam; whereby the beam parameter product of the combined laser beam is no greater than 1 times the beam parameter product of the individual laser beam; wherein the means for spatially combining increases the power of the laser beam while preserving the brightness of the individual laser beams; whereby the combined laser beam has a power that is at least 100× the power of the individual laser beam and whereby a beam parameter product of the combined laser beam is no greater than 2 times a beam parameter product of the individual laser beam; whereby the beam parameter product of the combined laser beam is no greater than 1.5 times the beam parameter product of the individual laser beam; whereby the beam parameter product of the combined laser beam is no greater than 1 times of the beam parameter product of the individual laser beam; wherein the optical fiber is solarization resistant; wherein the means for spatially combining has assemblies, selected from the group consisting of alignment plane parallel plates and wedges, to correct for at least one of position errors or pointing errors of a laser diode; wherein the means for spatially combining has a polarization beam combiner capable of increasing the effective brightness of the combined laser beams over the individual laser beams; wherein the laser diode assemblies define individual laser beam paths with space between each of the paths, whereby the individual laser beams have space between each beam; and wherein the means for spatially combining has a collimator for collimating the individual laser beams in a fast axis of the laser diodes, a periodic mirror for combining the collimated laser beams, wherein the periodic mirror is configured to reflect a first laser beam from a first diode in the laser diode assembly and transmits a second laser beam from a second diode in the laser diode assembly, whereby the space between the individual laser beams in the fast direction is filled; wherein the means for spatially combining has a patterned mirror on a glass substrate; wherein the glass substrate is of sufficient thickness to shift the vertical position of a laser beam from a laser diode to fill an empty space between the laser diodes; and, having a stepped heat sink.

Still further there is provided a laser system for providing a high brightness, high power laser beam, the system having: a plurality of laser diode assemblies; each laser diode assembly having a plurality of laser diodes capable of producing a blue laser beam having an initial brightness; a means for spatially combining the blue laser beams to make a combined laser beam having a final brightness and forming a single spot in the far-field that is capable of being coupled into a optical fiber; wherein each laser diode is locked by an external cavity to a different wavelength to substantially increase the brightness of the combined laser beam, whereby the final brightness of the combined laser beam is about the same as the initial brightness of the laser beams from the laser diode.

Further there is provided the methods and systems having one or more of the following features: wherein each laser diode is locked to a single wavelength using an external cavity based on a grating and each of the laser diode assembly are combined into a combined beam using a combining means selected from the group consisting of a narrowly spaced optical filter and a grating; wherein the Raman convertor is an optical fiber that has a pure fused silica core to create a higher brightness source and a fluorinated outer core to contain the blue pump light; wherein the Raman convertor is used to pump a Raman convertor such as an optical fiber that has a $GeO_2$ doped central core with an outer core to create a higher brightness source and an outer core that is larger than the central core to contain the blue pump light; wherein the Raman convertor is an optical fiber that has a $P_2O_5$ doped core to create a higher brightness source and an outer core that is larger than the central core to contain the blue pump light; wherein the Raman convertor an optical fiber that has a graded index core to create a higher brightness source and an outer core that is larger than the central core to contain the blue pump light; wherein the Raman convertor is a graded index $GeO_2$ doped core and an outer step index core; wherein the Raman convertor is used to pump a Raman convertor fiber that is a graded index $P_2O_5$ doped core and an outer step index core; wherein the Raman convertor is used to pump a Raman convertor fiber that is a graded index $GeO_2$ doped core; wherein the Raman convertor is a graded index $P_2O_5$ doped core and an outer step index core; wherein the Raman convertor is a diamond to create a higher brightness laser source; wherein the Raman convertor is a KGW to create a higher brightness laser source; wherein the Raman convertor is a $YVO_4$ to create a higher brightness laser source; wherein the Raman convertor is a $Ba(NO_3)_2$ to create a higher brightness laser source; and, wherein the Raman convertor is a high pressure gas to create a higher brightness laser source.

Still further there is provided a laser system for performing laser operations, the system having: a plurality of laser diode assemblies; each laser diode assembly having a plurality of laser diodes capable of producing a blue laser beam along a laser beam path; a means for spatially combining the blue laser beams to make a combined laser beam having a single spot in the far-field that is capable of being optically coupled to a Raman convertor, to pump the Raman converter, to increase the brightness of the combined laser beam.

Additionally there is provided a method of providing a combined laser beam, the method having operation an array of Raman converted lasers to generate blue laser beams at individual different wavelengths and combined the laser beams to create a higher power source while preserving the spatial brightness of the original source.

Yet further there is provided a laser system for performing laser operations, the system having: a plurality of laser diode assemblies; each laser diode assembly having a plurality of laser diodes capable of producing a blue laser beam along a laser beam path; beam collimating and combining optics along the laser beam path, wherein a combined laser beam is capable of being provided; and an optical fiber for receiving the combined laser beam.

Moreover there is provided the methods and systems having one or more of the following features: wherein the optical fiber is in optical communication with a rare-earth doped fiber, whereby the combined laser beam is capable of pumping the rare-earth doped fiber to create a higher brightness laser source; and, wherein the optical fiber is in optical communication with an outer core of a brightness convertor, whereby the combined laser beam is capable of pumping the outer core of a brightness convertor to create a higher ratio of brightness enhancement.

Still further the is provided a Raman fiber having: dual cores, wherein one of the dual cores is a high brightness central core; and, a means to suppress a second order Raman signal in the high brightness central core selected from the group consisting of a filter, a fiber bragg grating, a difference in V number for the first order and second order Raman signals, and a difference in micro-bend losses.

In addition there is provided a second harmonic generation system, the system having: a Raman convertor at a first wavelength to generate light at half the wavelength of the first wavelength; and an externally resonant doubling crystal configured to prevent the half wavelength light from propagating through the optical fiber.

Moreover there is provided the methods and systems having one or more of the following features: wherein the first wave length is about 460 nm; and the externally resonant doubling crystal is KTP; and, wherein the Raman convertor has a non-circular outer core structured to improve Raman conversion efficiency.

Further there is provided a third harmonic generation system, the system having: a Raman convertor at a first wavelength to generate light at a second lower wavelength than the first wavelength; and an externally resonant doubling crystal configured to prevent the lower wavelength light from propagating through the optical fiber.

Further there is provided a fourth harmonic generation system, the system having: a Raman convertor to generate light at 57.5 nm using an externally resonant doubling crystal configured to prevent the 57.5 nm wavelength light from propagating through the optical fiber.

Further there is provided a second harmonic generation system, the system having a rare-earth doped brightness convertor having Thulium that lases at 473 nm when pumped by an array of blue laser diodes at 450 nm, to generate light at half the wavelength of the source laser or 236.5 nm using an externally resonant doubling crystal but does not allow the short wavelength light to propagate through the optical fiber.

Further there is provided a third harmonic generation system, the system having a rare-earth doped brightness convertor, having Thulium that lases at 473 nm when pumped by an array of blue laser diodes at 450 nm to generate light at 118.25 nm using an externally resonant doubling crystal but does not allow the short wavelength light to propagate through the optical fiber.

Further there is provided a fourth harmonic generation system, the system having a rare-earth doped brightness convertor, having Thulium that lases at 473 nm when pumped by an array of blue laser diodes at 450 nm to generate light at 59.1 nm using an externally resonant doubling crystal but does not allow the short wavelength light to propagate through the optical fiber.

Still additionally there is provided a laser system for performing laser operations, the system having: at least three of laser diode assemblies; each of the at least laser diode assemblies has at least ten laser diodes, wherein each of the at least ten laser diodes is capable of producing a blue laser beam, having a power of at least about 2 Watts and a beam parameter product of less than 8 mm-mrad, along a laser beam path, wherein each laser beam path is essentially parallel, whereby a space is defined between the laser beams traveling along the laser beam paths; a means for spatially combining and preserving brightness of the blue laser beams positioned on all of the at least thirty laser beam paths, the means for spatially combining and preserving brightness having a collimating optic for a first axis of a laser beam, a vertical prism array for a second axis of the laser beam, and a telescope; whereby the means for spatially combining and preserving fills in the space between the laser beams with laser energy, thereby providing a combined laser beam a power of at least about 600 Watts, and a beam parameter product of less than 40 mm-mrad.

Yet further there is provided an addressable array laser processing system, the addressable array laser processing system having: at least three laser systems of the type presently described; each of the at least three laser systems configured to couple each of their combined laser beams into a single optical fiber; whereby each of the at least the three combined laser beams being capable of being transmitted along its coupled optical fiber; the at least three optical fibers in optical association with a laser head; and a control system; wherein the control system has a program having a predetermined sequence for delivering each of the combined laser beams at a predetermined position on a target material.

Moreover there is provided the methods and systems for an addressable array having one or more of the following features: wherein a predetermined sequence for delivering having individually turning on and off the laser beams from the laser head, thereby imaging onto a bed of powder to melt and fuse the target material having a powder into a part; wherein the fibers in the laser head are configured in an arrangement selected from the group consisting of linear, non-linear, circular, rhomboid, square, triangular, and hexagonal; wherein the fibers in the laser head are configured in an arrangement selected from the group consisting of 2×5, 5×2, 4×5, at least 5× at least 5, 10×5, 5×10 and 3×4; wherein the target material has a powder bed; and, having: an x-y motion system, capable of transporting the laser head across a powder bed, thereby melting and fusing the powder bed; and a powder delivery system positioned behind the laser source to provide a fresh powder layer behind the fused layer; having: a z-motion system, capable of transporting the laser head to increment and decrement a height of the laser head above a surface of the powder bed; having: a bi-directional powder placement device capable of placing powder directly behind the delivered laser beam as it travels in the positive x direction or the negative x direction; having a powder feed system that is coaxial with a plurality of laser beam paths; having a gravity feed powder system; having a powder feed system, wherein the powder is entrained in an inert gas flow; having a powder feed system that is transverse to N laser beams where N≥1 and the powder is placed by gravity ahead of the laser beams; and having a powder feed system that is transverse to N laser beams where N≥1 and the powder is entrained in an inert gas flow which intersects the laser beams.

Yet still further there is provided a method of providing a combined blue laser beam having high brightness, the method having: operating a plurality of Raman converted lasers to provide a plurality of individual blue laser beams and combining the individual blue laser beams to create a higher power source while preserving the spatial brightness of the original source; wherein the individual laser beams of the plurality have different wavelengths.

Moreover there is provided a method of laser processing a target material, the method having: operating an addressable array laser processing system having at least three laser systems of the type of the presently described systems to generate three individual combined laser beams into three individual optical fibers; transmitting each combined laser beams along its optical fiber to a laser head; and directing the three individual combined laser beams from the laser head in a predetermined sequence at a predetermined position on a target material.

BRIEF DESCRIPTION OF THE DRAWINGS

FIG. 4 is a table providing processing parameters in accordance with the present inventions.

FIG. 14A is a schematic of an embodiment of a laser fiber bundle arrangement for use in an embodiment of a laser array system in accordance with the present inventions.

FIG. 14B is a schematic of an embodiment of a laser fiber bundle arrangement for use in an embodiment of a laser array system in accordance with the present inventions.

FIG. 14C is a schematic of an embodiment of a laser fiber bundle arrangement for use in an embodiment of a laser array system in accordance with the present inventions.

DESCRIPTION OF THE PREFERRED EMBODIMENTS

Figure 1:
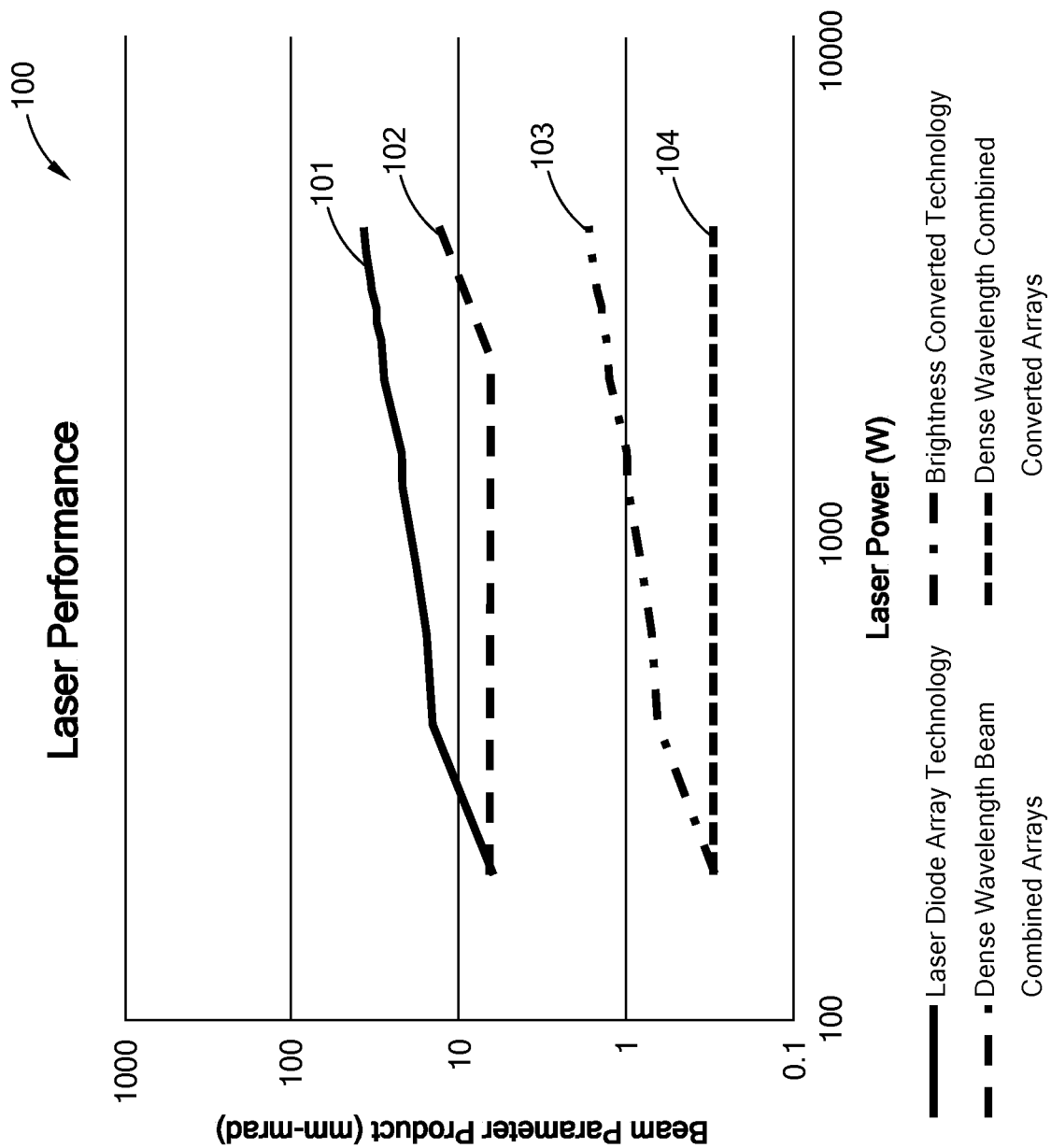
FIG. 1 is a graph showing laser performance of embodiments in accordance with the present inventions.

In general, the present inventions relate to the combining of laser beams, systems for making these combinations and processes utilizing the combined beams. In particular, the present inventions relate to arrays, assemblies and devices for combining laser beams from several laser beam sources into one or more combined laser beams. These combined laser beams preferably have preserved, enhanced, and both, various aspects and properties of the laser beams from the individual sources.

Embodiments of the present array assemblies, and the combined laser beams that they provide can find wide-ranging applicability. Embodiments of the present array assemblies are compact and durable. The present array assemblies have applicability in: welding, additive manufacturing, including 3-D printing; additive manufacturing-milling systems, e.g., additive and subtractive manufacturing; astronomy; meteorology; imaging; projection, including entertainment; and medicine, including dental, to name a few.

Although this specification focuses on blue laser diode arrays, it should be understood that this embodiment is only illustrative of the types of array assemblies, systems, processes and combined laser beams contemplated by the present inventions. Thus, embodiments of the present inventions include array assemblies for combining laser beam from various laser beam sources, such as solid state lasers, fiber lasers, semiconductor lasers, as well as other types of lasers and combinations and variations of these. Embodiments of the present invention include the combining of laser beams across all wavelengths, for example laser beams having wavelengths from about 380 nm to 800 nm (e.g., visible light), from about 400 nm to about 880 nm, from about 100 nm to about 400 nm, from 700 nm to 1 mm, and combinations, variations of particular wavelengths within these various ranges. Embodiments of the present arrays may also find application in microwave coherent radiation (e.g., wavelength greater than about 1 mm). Embodiments of the present arrays can combine beams from one, two, three, tens, or hundreds of laser sources. These laser beams can have from a few mil watts, to watts, to kilowatts.

An embodiment of the present invention consists of an array of blue laser diodes that are combined in a configuration to preferably create a high brightness laser source. This high brightness laser source may be used directly to process materials, i.e. marking, cutting, welding, brazing, heat treating, annealing. The materials to be processed, e.g., starting materials or target materials, can include any material or component or composition, and for example, can include semiconductor components such as but not limited to TFTs (thin film transistors), 3-D printing starting materials, metals including gold, silver, platinum, aluminum and copper, plastics, tissue, and semiconductor wafers to name a few. The direct processing may include, for example, the ablation of gold from electronics, projection displays, and laser light shows, to name a few.

Embodiments of the present high brightness laser sources may also be used to pump a Raman laser or an Anti-Stokes laser. The Raman medium may be a fiber optic, or a crystal such as diamond, KGW (potassium gadolinium tungstate, $KGd(WO_4)_2$), $YVO_4$, and $Ba(NO_3)_2$. In an embodiment the high brightness laser sources are blue laser diode sources, which are a semiconductor device operating in the wavelength range of 400 nm to 500 nm. The Raman medium is a brightness convertor and is capable of increasing the brightness of the blue laser diode sources. The brightness enhancement may extend all the way to creating a single mode, diffraction limited source, i.e., beam having an $M^2$ of about 1 and 1.5 with beam parameter products of less than 1, less than 0.7, less than 0.5, less than 0.2 and less than 0.13 mm-mrad depending upon wavelength.

In an embodiment "n" or "N" (e.g., two, three, four, etc., tens, hundreds, or more) laser diode sources can be configured in a bundle of optical fibers that enables an addressable light source that can be used to mark, melt, weld, ablate, anneal, heat treat, cut materials, and combinations and variations of these, to name a few laser operations and procedures.

An array of blue laser diodes can be combined, with an optical assembly, to create a high brightness direct diode laser system, which can provide a high brightness combined laser beam. FIG. 1 shows a table 100 for the laser performance (beam parameter product vs. laser power in W (Watts)) of embodiments of a range of beam parameter products when using a fiber combiner technique with the brightness ranging from 8 mm-mrad at 200 Watts to 45 mm-mrad at 4000 Watts. Line 101 plots the performance for an embodiment of a laser diode array. Line 102 plots the performance of dense wavelength beam combined arrays. Line 103 plots the performance of the brightness converting technology when scaled using a fiber combiner technique. Line 104 plots the performance of the brightness converting technology when using dense wavelength combining of the outputs of the brightness convertor. This allows the combined beam to remain a single spatial mode or a near single spatial mode as the power level is scaled. The dense wavelength combining uses gratings to control the wavelength of each individual brightness converted laser, followed by gratings to combing the beams into a single beam. The gratings can be ruled gratings, holographic gratings, Fiber Bragg Gratings (FBG), or Volume Bragg Gratings (VBG). It is also feasible to use a prism, although the preferred embodiment is to use the gratings.

Figure 2A:
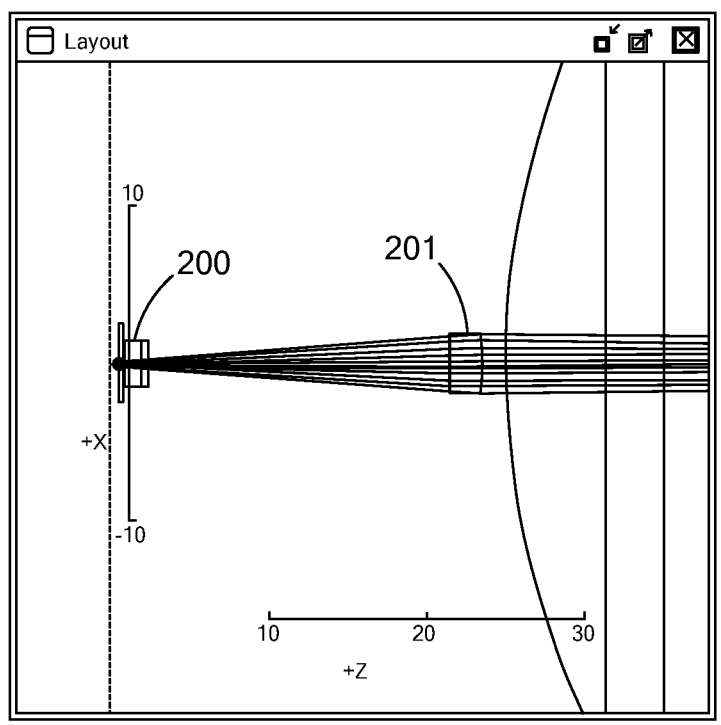
FIG. 2A is a schematic of a laser diode and axis focusing lens in accordance with the present inventions.

FIG. 2A is a schematic of a laser diode 200 that is propagating a laser beam along a laser beam path to a Fast Axis Collimating lens 201 (FAC). A 1.1, 1.2, 1.5, 2 or even 4 mm, cylindrical aspheric lens is used to capture the fast axis power and create a diffraction limited beam in the fast axis with the correct height to preserve the brightness and allow a combination of the beams further down the optical chain. The collimating lens 202 is for collimating the slow axis of the laser diode (the axis with the smaller divergence angle, typically the x axis). A 15, 16, 17, 18 or 21 mm focal length cylindrical aspheric lens captures the slow axis power and collimates the slow axis to preserve the brightness of the laser source. The focal length of the slow axis collimator results in an optimized combination of the laser beam lets by the optical system into the target fiber diameter. In preferred embodiments of the arrays, both a slow axis and a fast axis collimating lens are located along each of the laser beam paths and are used to shape the individual laser beams.

Figure 2B:
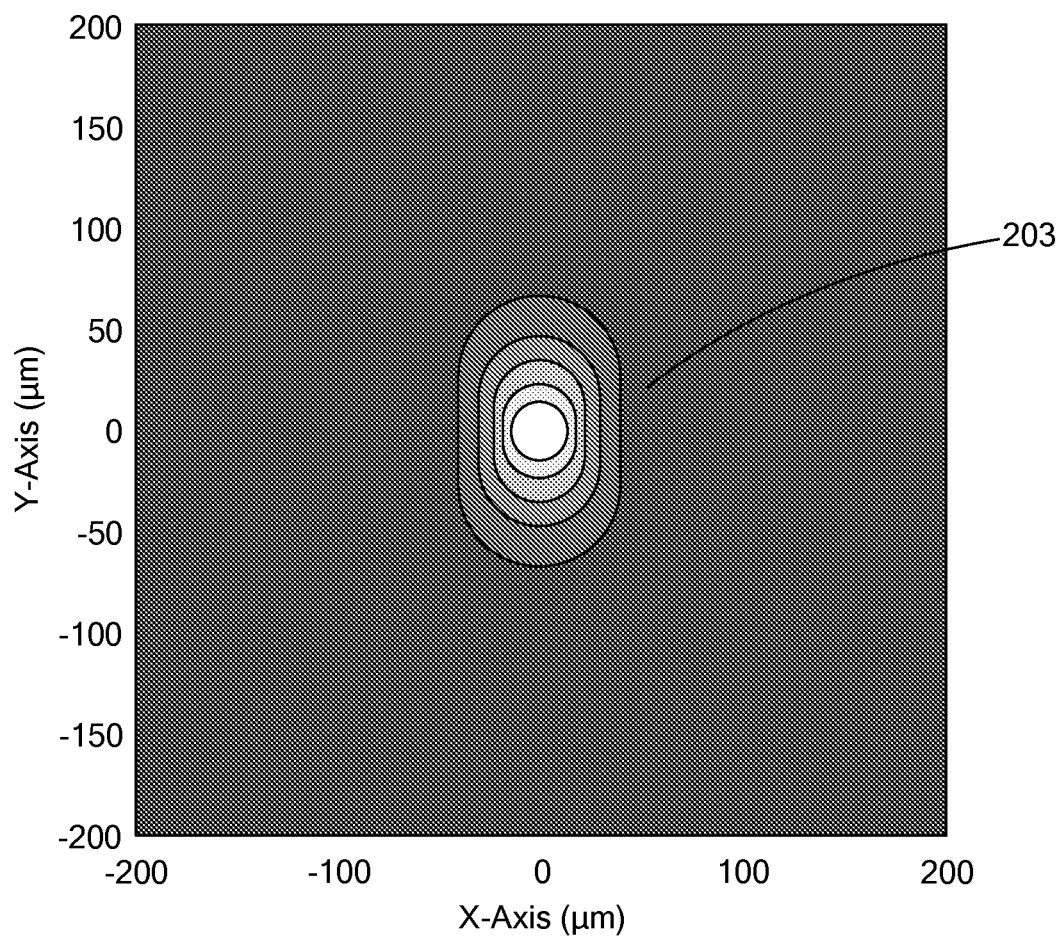
FIG. 2B is a schematic of an embodiment of a laser diode spot after fast and slow axis focusing in accordance with the present inventions.

FIG. 2B is a schematic of a laser beam spot 203 that was formed by the laser beam from a laser diode passing through both a fast and slow axis focusing lens. This simulation takes into account the maximum divergence of the source across the complete aperture of the source. It being understood that many different shaped laser beam spots can be created, such as a square, rectangle, circle, oval, linear and combinations and variations of these and other shapes. For example, the combined laser beam creates a spot 203, with blue laser light, focused to a spot size of 100 μm with 100 mm focal length lens, at an NA of 0.18.

Figure 2C:
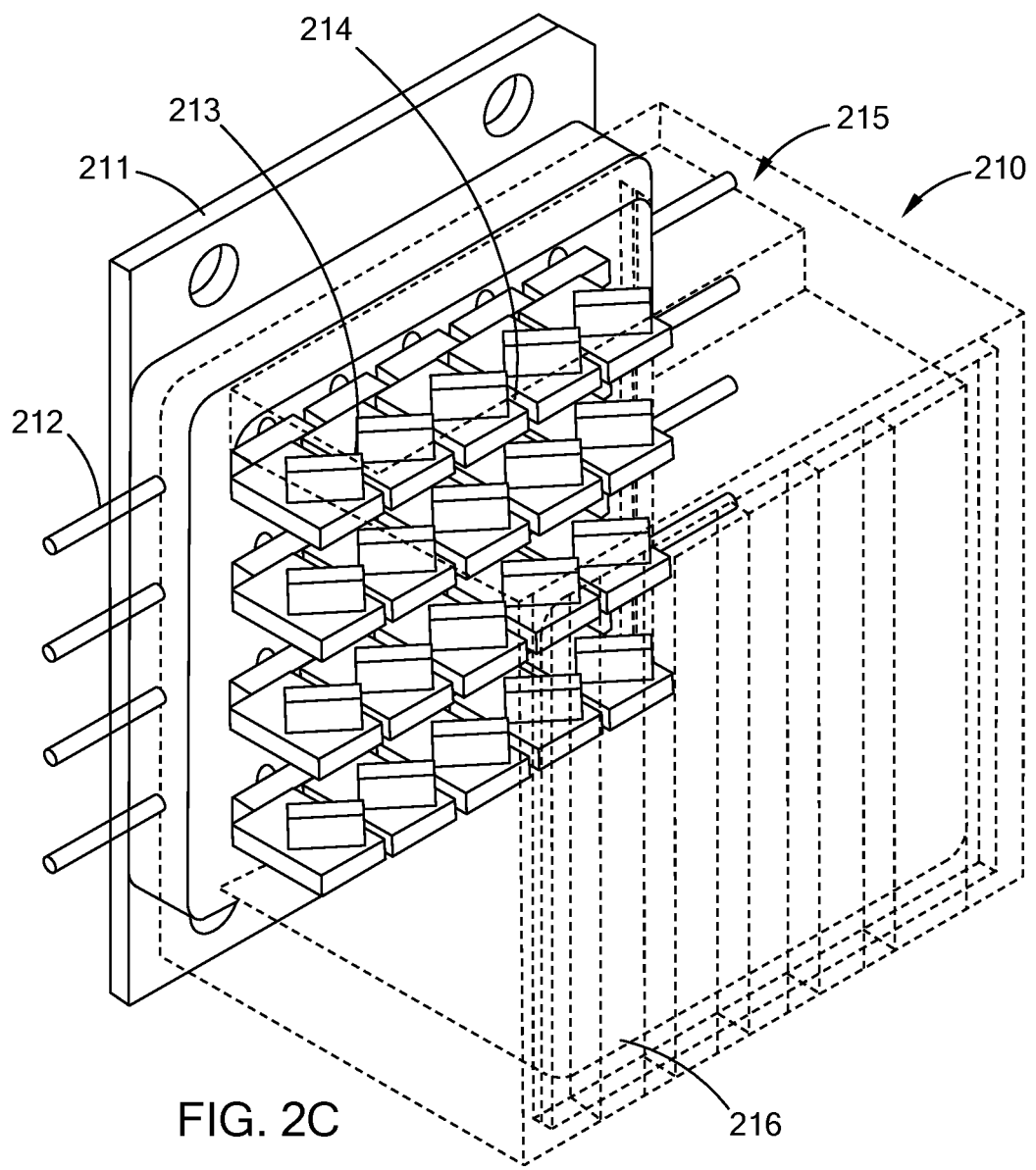
FIG. 2C is a prospective view of an embodiment of a laser diode assembly in accordance with the present inventions.
Figure 2E:
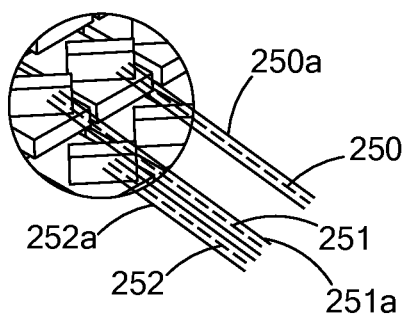
FIG. 2E is a partial view of the embodiment of FIG. 2C showing laser beams, laser beam paths and space between the laser beams in accordance with the present inventions.
Figure 2F:
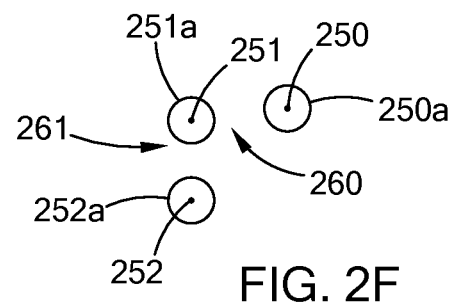
FIG. 2F is a cross sectional view of the laser beams, laser beam paths and space between the laser beams of FIG. 2E.
Figure 2D:
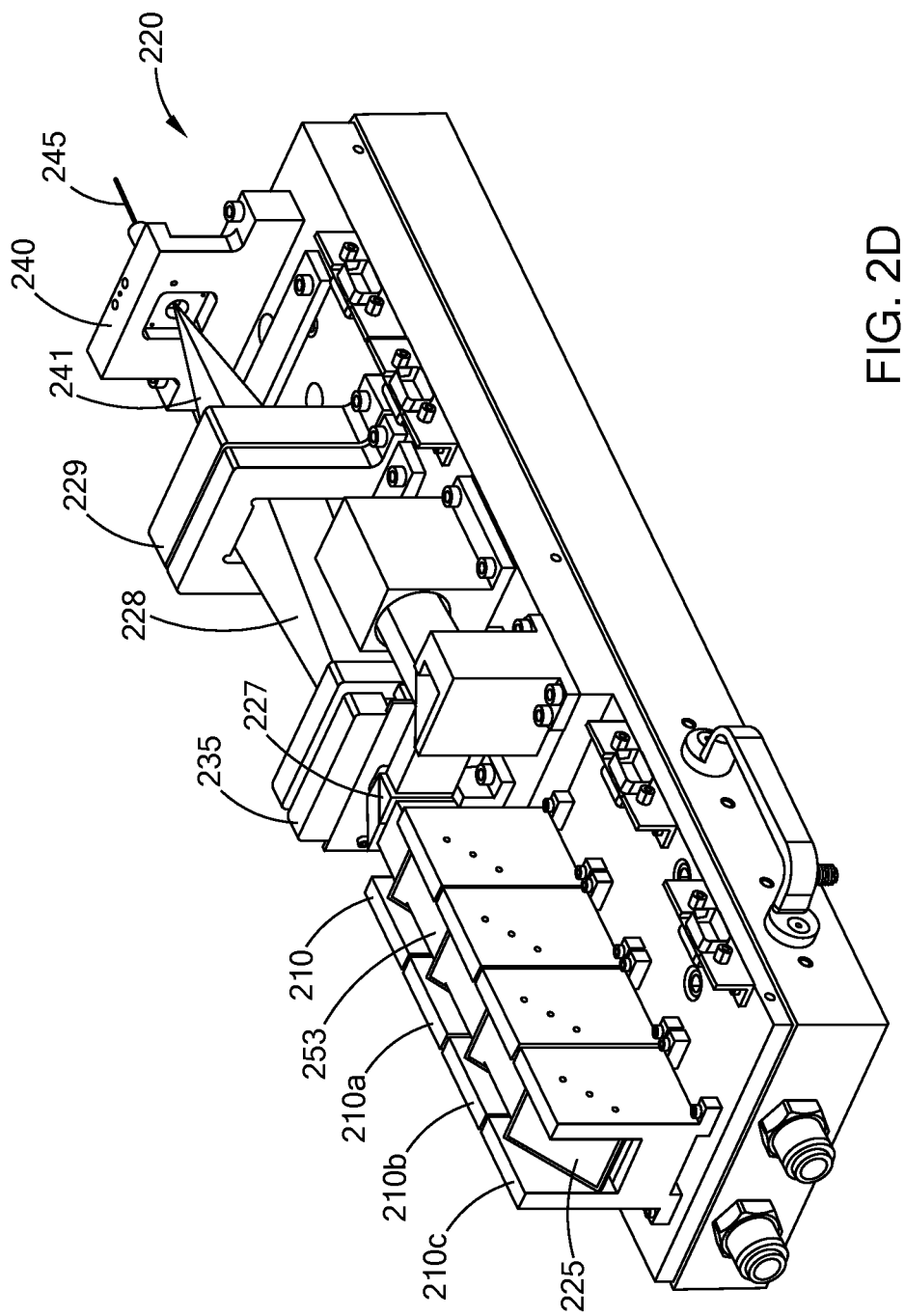
FIG. 2D is a prospective view of an embodiment of a laser diode module in accordance with the present inventions.

Turning to FIGS. 2C and 2D there is shown an embodiment of a laser diode subassembly 210 (e.g., diode module, bar, plate, multi-die package) and a laser diode module 220 having four laser diode assemblies 210, 210a, 210b, 210c.

In FIG. 2E there is shown a detailed view showing portions of some of the laser beams 250a, 251a, 252a, along their respective laser beam paths 250, 251, 252. FIG. 2F is a cross sectional view of the laser beams of FIG. 2E, showing the open space horizontal 260 and vertical 261 (based upon the orientation of the figure). The beam combining optics closes the beams spatially together, to eliminate the open spaces, e.g., 260, 261, in the final spot 203 (FIG. 2B).

The laser diode module 220 is capable of producing a combined laser beam, preferably a combined blue laser beam, having the performance of the curve 101 of FIG. 1. The laser diode assembly 210 has a baseplate 211, which is a thermally conductive material, e.g., copper, that has power leads (e.g., wires) e.g., 212, entering to provide electrical power to the diodes, e.g., 213. In this embodiment of the multi-die package, there are 20 laser diodes, e.g., 213, arranged in a 5×4 configuration behind a cover plate. Other configurations are contemplated, e.g., 4×4, 4×6, 5×6 10×20, 30×5, and in development today, etc., and combinations and variations of these, to provide n×n diodes in an assembly. Each diode may have a plane parallel plate for translating the position of the beam in the slow axis, e.g., 214 when using a single slow axis collimating (SAC) lens across multiple rows, e.g., 216. The plane parallel plate is not necessary when using individual slow axis lenses for each laser diode, which is the preferred embodiment. The plane parallel plates correct the position of the laser beam path in the slow axis as it propagates from each of the individual laser diodes, which may be a result of the assembly process. The plane parallel plates are not required if individual FAC/SAC lens pairs are used for each laser diode. The SAC position compensates for any assembly errors in the package. The result of both of these approaches is to align the beamlets to be parallel when either using individual lens pairs (FAC/SAC) or a shared SAC lens after individual FAC/plane parallel plates, providing parallel and spaced laser beams, e.g., 251a, 252a, 250a, and beam paths, e.g., 251, 252, 250.

Figure 2G:
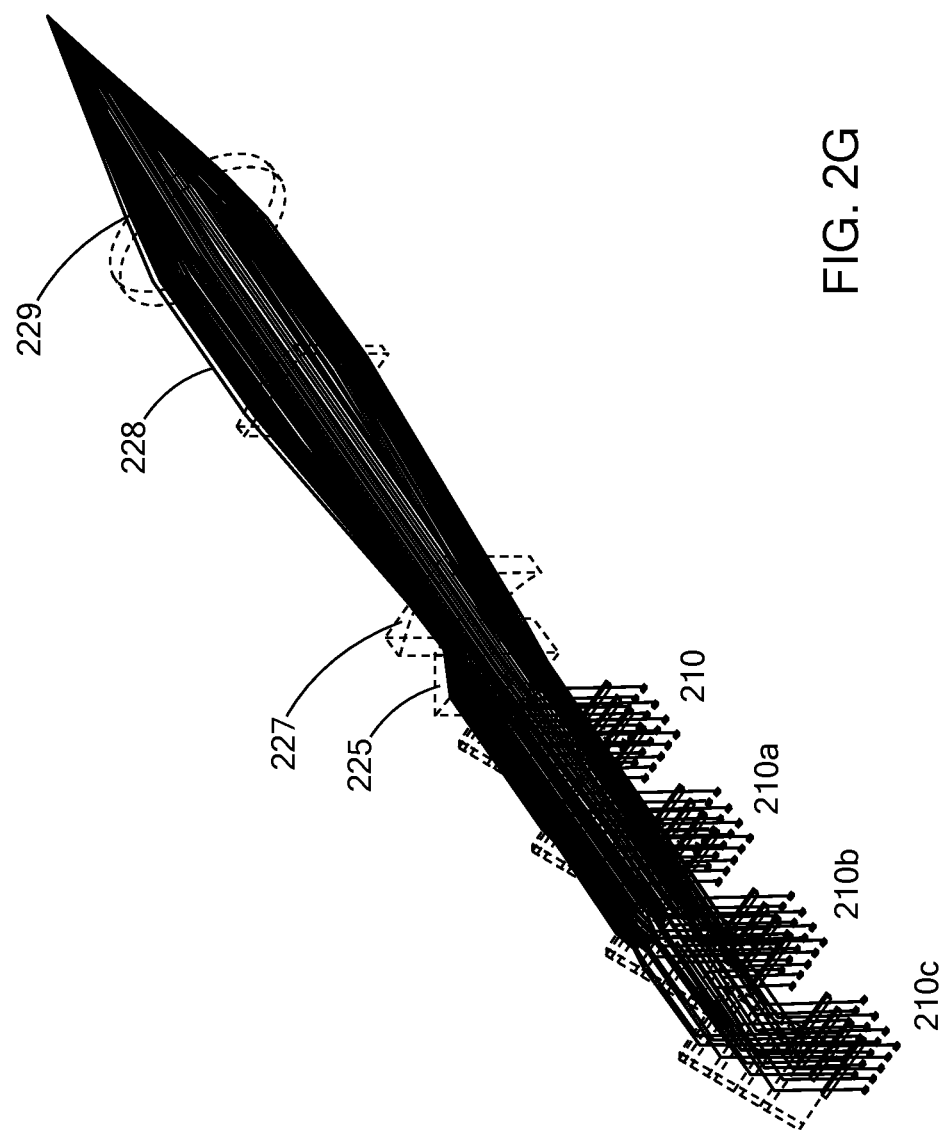
FIG. 2G is a prospective view of an embodiment of laser beams, beam paths and optics in accordance with the present inventions.
Figure 2H:
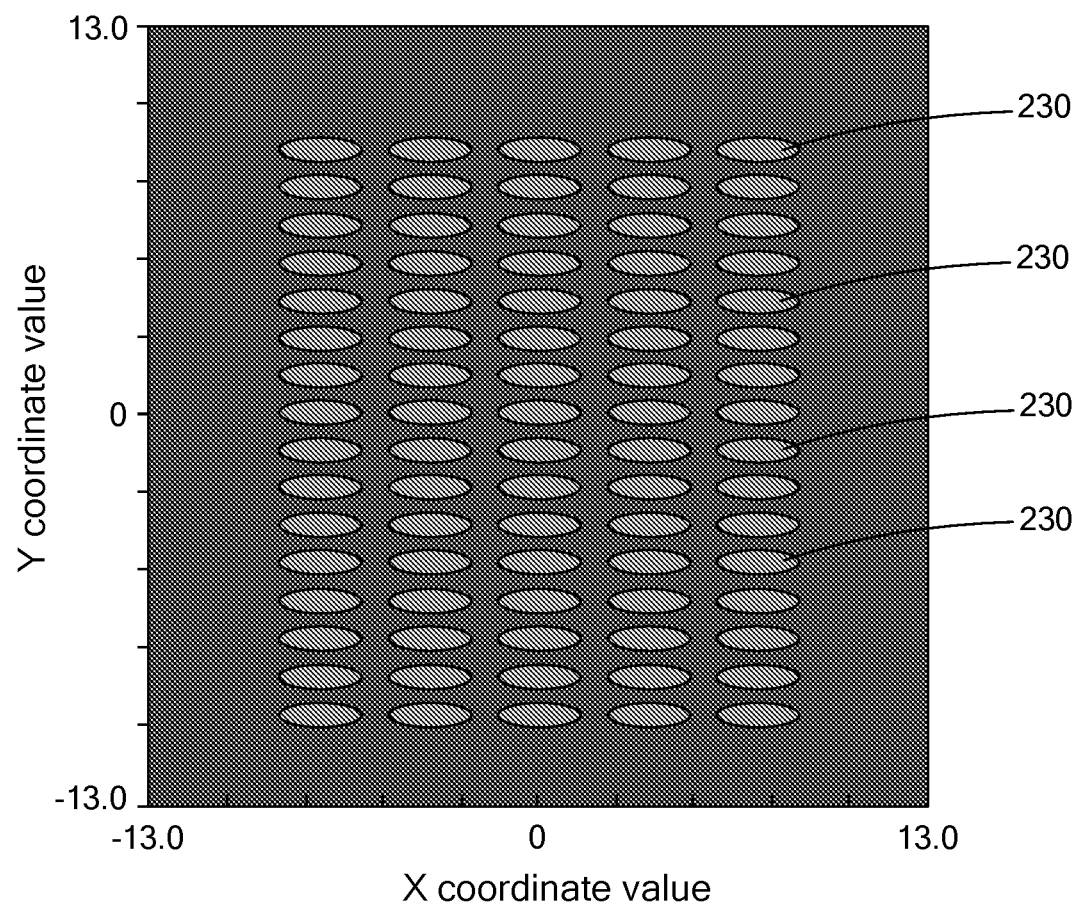
FIG. 2H is a view of the combined laser diode beams after the patterned mirrors in accordance with the present invention.
Figure 2I:
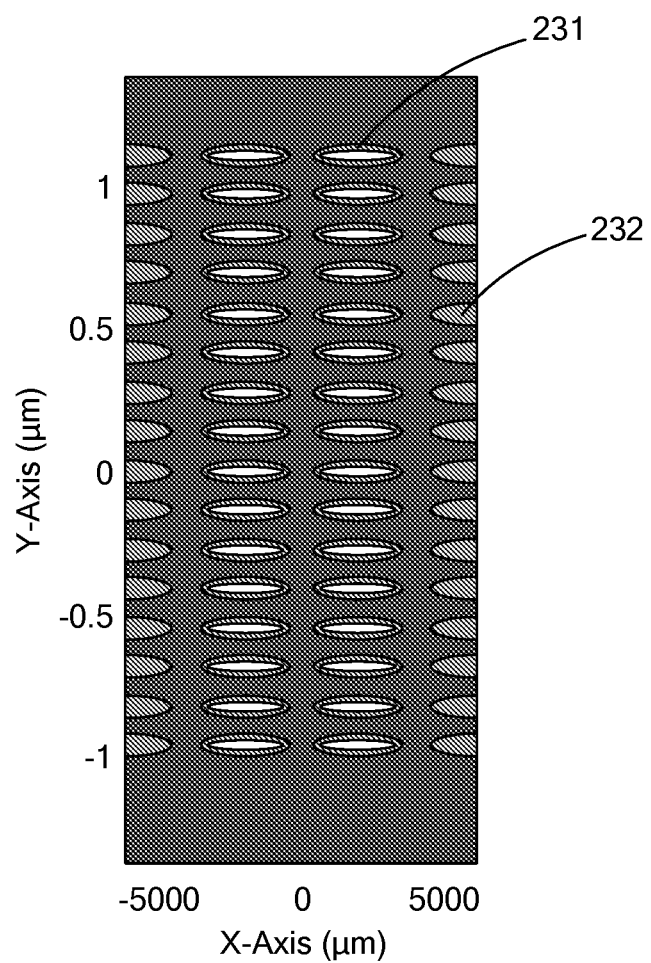
FIG. 2I is a view of the laser diode beams after the beam folder with an even split of the beams in accordance with the present invention.
Figure 2J:
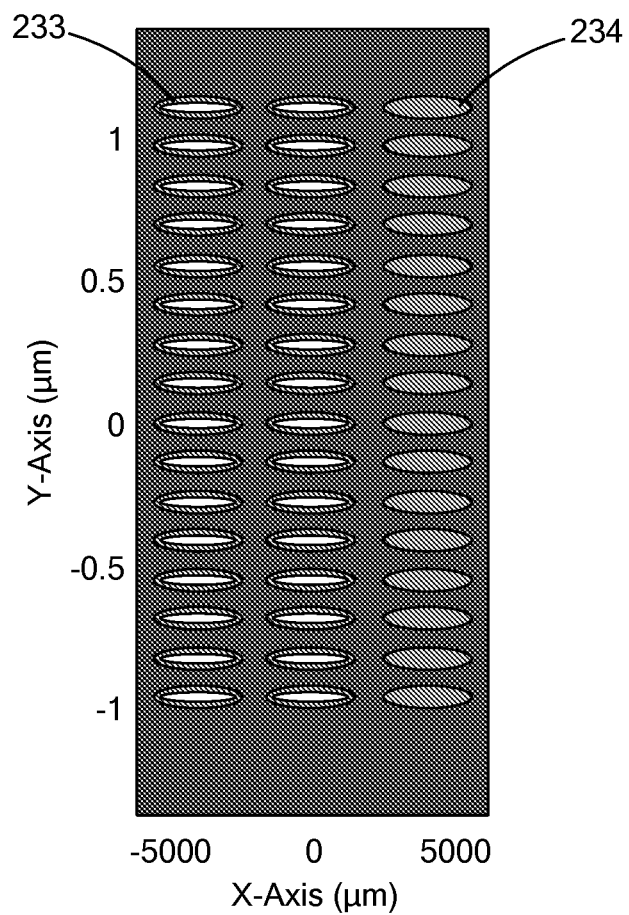
FIG. 2J is a view of a laser diode beams after the beam folder with a 3-2 column split in accordance with the present invention.

The composite beam from each of the laser diode subassemblies, 210, 210a, 210b, 210c, propagate to a patterned mirror, e.g., 225, which is used to redirect and combine the beams from the four laser diode subassemblies into a single beam, as shown in FIG. 2G. The four rows of collimate laser diodes are interlaced with the four rows of the other three packages creating the composite beam. FIG. 2H shows the position of the beams, e.g., 230, from laser subassembly 210. An aperture stop 235 clips off any unwanted scattered light from the combined beam lets, which reduces the heat load on the fiber input face. A polarization beam folding assembly 227 folds the beam in half in the slow axis to double the brightness of the composite laser diode beam FIG. 2I. The beam can be folded either by splitting the central emitter in the center resulting the pattern shown in FIG. 2I, where beam 231 is the overlay of two beam lets in the slow axis direction by polarization, and beam 232 is the split beam let which does not overlay any other emitters. If the beam is split in between the $2^{nd}$ and $3^{rd}$ beamlet (FIG. 2J), then the beam folder is more efficient and two of the columns of beams, e.g., 233 are overlapped, while the third column of beams, e.g, 234 simply passes straight through. The telescope assembly 228 either expands the combined laser beams in the slow axis or compresses the fast axis to enable the use of a smaller lens. The telescope 228 shown in this example (FIG. 2G) expands the beam by a factor of 2.6×, increasing its size from 11 mm to 28.6 mm while reducing the divergence of the slow axis by the same factor of 2.6×. If the telescope assembly compresses the fast axis then it would be a 2× telescope to reduce the fast axis from 22 mm height (total composite beam) to 11 mm height giving a composite beam that is 11 mm×11 mm. This is the preferred embodiment, because of the lower cost. An aspheric lens 229 focuses the composite beam into an optical fiber 245 that is at least 50, 100, 150, or 200 µm in diameter. The fiber output of multiple laser diode modules 220 are combined with a fiber combiner to produce higher output power level lasers according to FIG. 1 (line 101). The laser diode modules are combined using an optical combination method where the aspheric lens 229 and fiber combiner 240 are replaced with a set of shearing mirrors that then couple into an aspheric lens and the composite beam launched into the end of an optical fiber. In this manner one, two, three, tens, and hundreds of laser diode modules can be optically associated and their laser beams combined. In this manner combined laser beams can themselves be further, or additionally, combined to form a multiple-combined laser beam.

In the embodiment of FIGS. 2C and 2D, the configuration makes it feasible to launch, for example, up to 200 Watts of laser beam power into a single 50, 100, 150, or 200 µm core optical fiber. This embodiment of FIGS. 2C and 2D shows typical components to make, for example, a 200 W diode array assembly, e.g. a 200 W combined module, which uses up to four 50 Watt individual diode assemblies, e.g., 50 Watt modules.

It being understood that configurations, powers and combined beam numbers are feasible. The embodiment of FIGS. 2C and 2D minimizes the electrical connections from the power supply to the laser diodes.

Thus, the individual modules, the combined modules, and both can be configured to provide a single combined laser beam or multiple combined laser beams, e.g., two, three, four, tens, hundreds or more. These laser beams can each be launched in a single fiber, or they can be further combined to be launched into fewer fibers. Thus, by way of illustration 12 combined laser beams can be launched into 12 fibers, or the 12 beams can be combined and launched into fewer than 12 fibers, e.g., 10, 8, 6, 4 or 3 fibers. It should be understood that this combining can be of different power beams, to either balance or unbalance the power distribution between individual fibers; and can be of beams having different or the same wavelengths.

In an embodiment the brightness of an array of laser diodes can be improved by operating each array at a different wavelength and then combining them with either a grating or series of narrow band dichroic filters. The brightness scaling of this technology is shown in FIG. 1 as the near straight line 102. The starting point is the same brightness as can be achieved by a single module, since each module will be spatially overlapped on the previous modules in a linear fashion, the fiber diameter does not change, but the power launched does result in a higher brightness from the wavelength beam combined modules.

In an embodiment an array of blue laser diodes can be converted to near single mode or single mode output with the help of a brightness convertor. The brightness convertor can be an optical fiber, a crystal or a gas. The conversion process proceeds via Stimulated Raman Scattering which is achieved by launching the output from an array of blue laser diodes into an optical fiber or crystal or gas with a resonator cavity. The blue laser diode power is converted via Stimulated Raman Scattering to gain and the laser resonator oscillates on the first Stokes Raman line, which is offset from the pump wavelength by the Stokes shift. For example the embodiment shown in FIG. 3 and associated disclosure in the specification of U.S. patent application Ser. No. 14/787,393, which is based upon WO 2014/179345, the entire disclosure of which is incorporated herein by reference. The performance characteristics of this technology is shown in FIG. 1, line 103 with the brightness beginning at 0.3 mm-mrad for a 200 W laser and 2 mm-mrad for a 4000 W laser when using a fiber combiner to combine multiple high brightness laser beams.

The brightness of a blue laser source can be further increased by combining the outputs of the brightness converted sources. The performance of this type of embodiment is shown by line 104 of FIG. 1. Here the brightness is defined by the starting module at 0.3 mm-mrad. The gain-bandwidth of the Raman line is substantially broader than that of the laser diodes, so more lasers can be combined via wavelength than for the laser diode technology alone. The result is a 4 kW laser with a brightness the same as the 200 W laser, or 0.3 mm-mrad. This is indicated on FIG. 1 by the flat line 104.

The technology of the present inventions described in this specification can be used to configure a laser system for a wide range of applications ranging from welding, cutting, brazing, heat treating, sculpting, shaping, forming, joining, annealing and ablating, and combinations of these and various other material processing operations. While the preferred laser sources are relatively high brightness, the present inventions provide for the ability to configure systems to meet lower brightness requirements. Furthermore, groups of these lasers can be combined into a long line, which can be used to perform laser operations on larger areas of target materials, such as for example, annealing large area semiconductor devices such as the TFT's of a flat panel display.

The output of either the laser diodes, laser diode arrays, wavelength combined laser diode arrays, brightness converted laser diode arrays and wavelength combined laser diode arrays can be used to create a unique individually addressable printing machine. Since the laser power from each module is sufficient to melt and fuse plastic, as well as, metal powders, these sources are ideal for the additive manufacturing application, as well as additive-subtractive manufacturing applications (i.e., the present laser additive manufacturing system is combined with traditional removing manufacturing technologies, such as CNC machines, or other types of milling machines, as well as laser removal or ablation). Because of their, capability to provide small spot sizes, precision, and other factors, the present systems and laser configurations may also find applications in micro and nano additive, subtractive and additive-subtractive manufacturing technologies. An array of lasers that are individually connected, can be imaged onto the powder surface to create an object at n times the speed of a single scanned laser source. The speed can be further increased by using a higher power laser for each of the n-spots. When using the brightness converted lasers, a near diffraction limited spot can be achieved for each of the n-spots, thus making it feasible to create higher resolution parts because of the sub-micron nature of the individual spot formed with a blue high brightness laser source. This smaller spot size of the present configurations and systems provides a substantial improvement in the processing speed and the resolution of the printing process, compared to prior art 3-D printing technology. When combined with a portable powder feed device, embodiments of the present systems can continuously print layer after layer at a speeds in excess of 100× the print speeds of prior art additive manufacturing machines. By enabling the system to deposit powder as the positioning devices moves either in a positive or negative direction just behind the laser fusing spots (e.g., FIG. 5, powder device 508, powder device 508b), the system can continuously print without having to stop to apply or level the powder required for the next layer.

Figure 3:
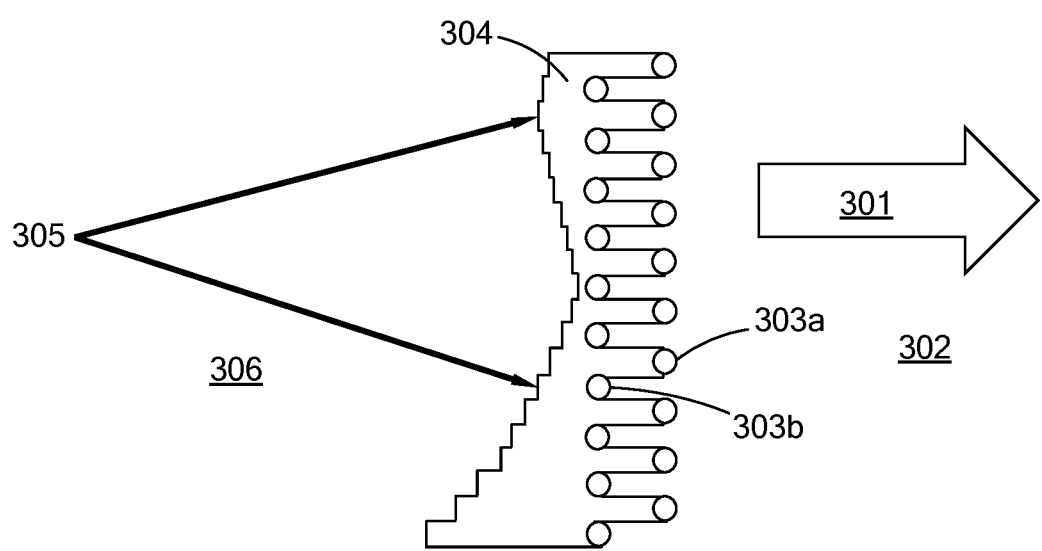
FIG. 3 is a schematic illustrating an embodiment of scanning of an embodiment of a laser diode array on a starting or target material in accordance with the present inventions.

Turning to FIG. 3 there is a schematic of a laser process with a laser system having two rows of staggered spots, e.g., 303a and spots, e.g., 303b. The laser spots, e.g., 303a, 303b are moved, e.g., scanned, in the direction of arrow 301 across the target material. The target material could be in a power form 302, which is then melted buy the laser spots 304 and then solidifies, generally along transition line 305, to form as a fused material 306. The powers of the beam, the firing time of the beams, the speed of movement and the combinations of these, can be varied in a predetermined manner resulting in a predetermined shape of the melt transition line 305. The distance the beam can be staggered can be 0, 0.1, 0.5, 1, 2 mm apart as needed by the fixturing required to hold the fibers and their optical components. The stagger may also be a monotonically increasing or decreasing position at a set stagger step-size or a varying step-size. The exact speed advantage will depend on the target material and configuration of the parts to be manufactured.

Figure 5:
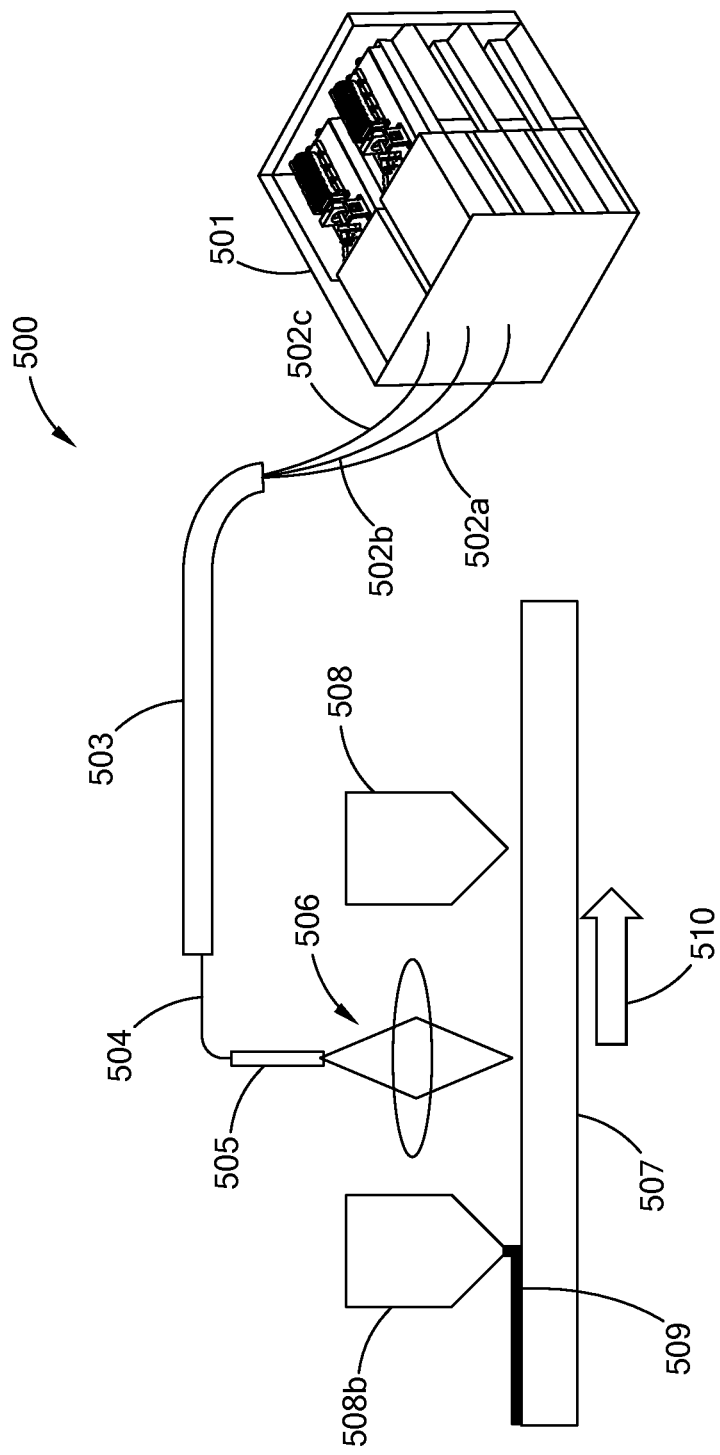
FIG. 5 is a schematic of an embodiment of a laser array system and process in accordance with the present inventions.
Figure 6:
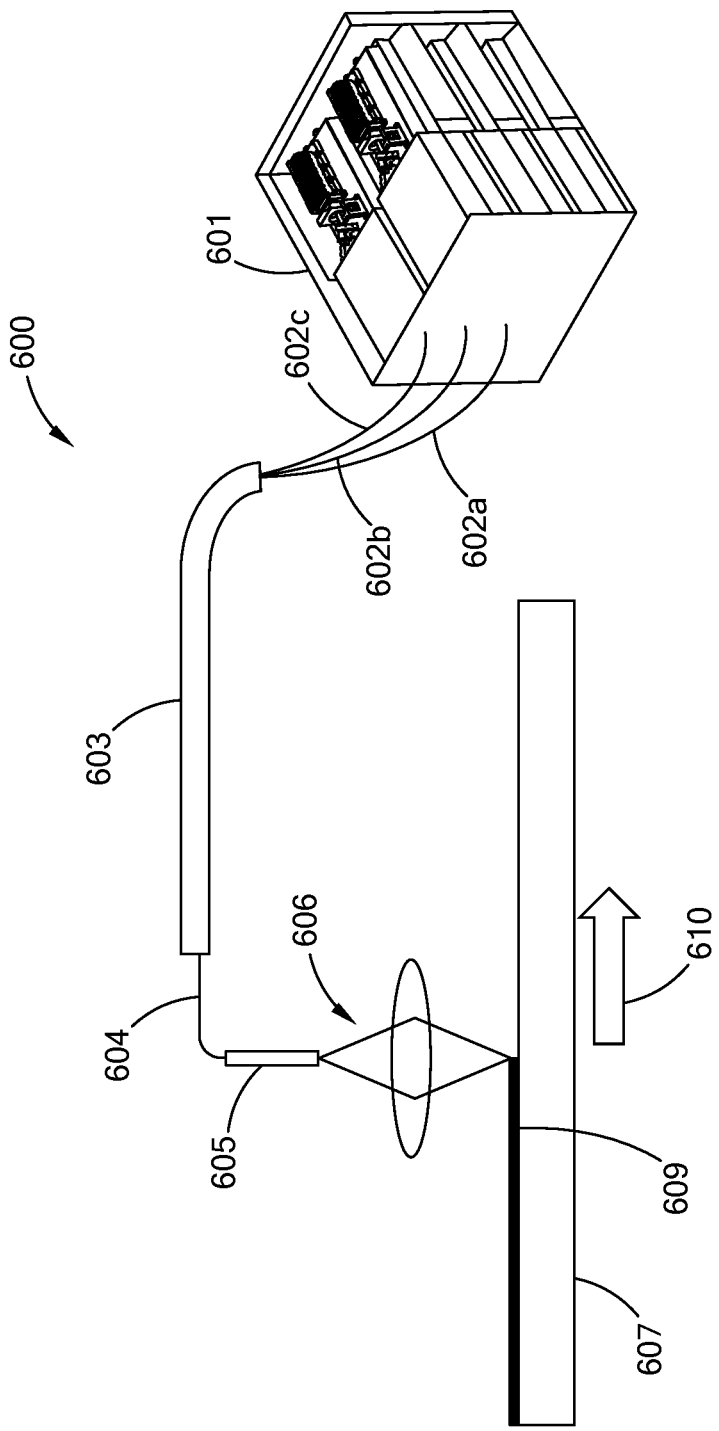
FIG. 6 is a schematic of an embodiment of a laser array system and process in accordance with the present inventions.
Figure 7:
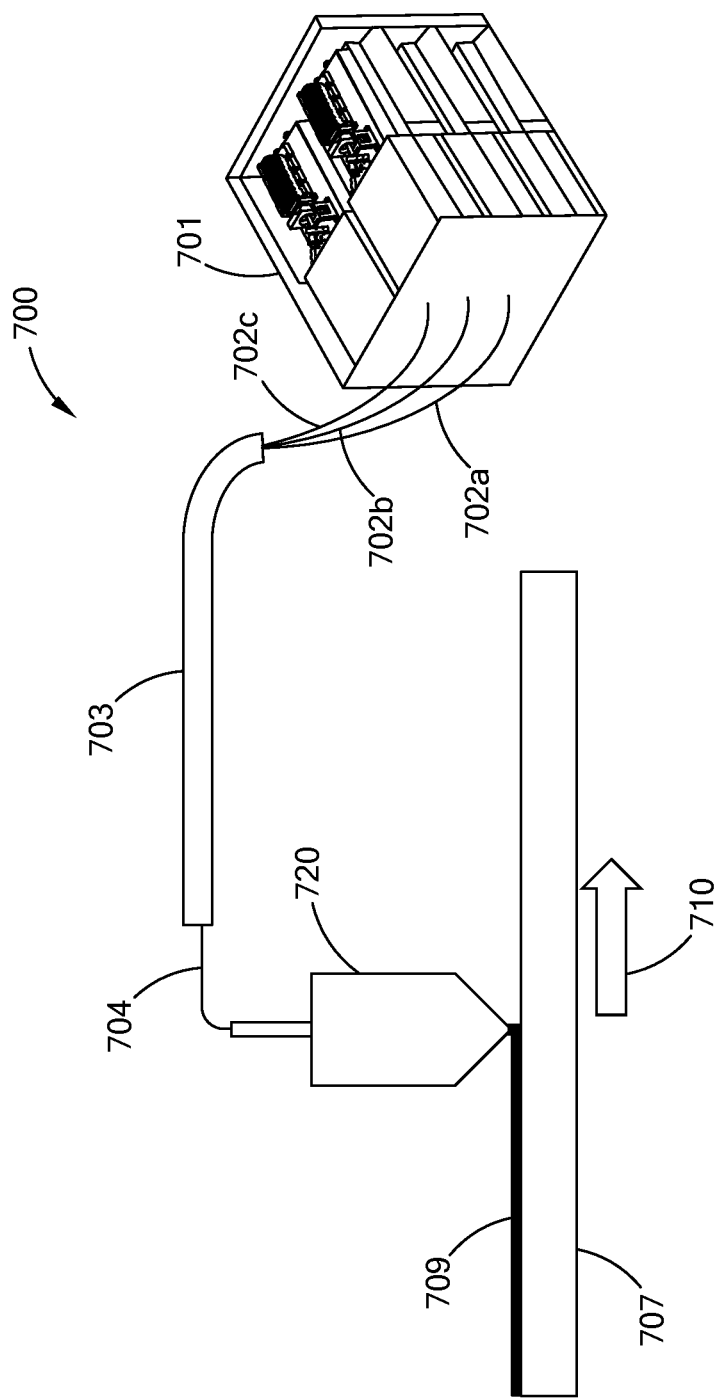
FIG. 7 is a schematic of an embodiment of a laser array system and process in accordance with the present inventions.

FIG. 4 summarizes the performance than can achieved for embodiments of the laser systems and configurations, such as those depicted in FIGS. 5-7 for a 20 beam system, the speed increases with each additional beam that is added to the system.

Turning to FIG. 5 there is provided a schematic of an embodiment of a laser system with an addressable laser delivery configuration. The system has an addressable laser diode system 501. The system 501 provides independently addressable laser beams to a plurality of fibers 502a, 502b, 502c (greater and lower numbers of fibers and laser beams are contemplated). The fibers 502a, 502b, 502c are combined into a fiber bundle 504 that is contained in protective tube 503, or cover. The fibers 502a, 502b, 502c in fiber bundle 504 are fused together to form a printing head 505 that includes an optics assembly 506 that focuses and directs the laser beams, along beam paths, to a target material 507. The print head and the powder hoppers move together with the movement of the print head being in the positive direction according to 510. Additional material 509 can be placed on top of the fused material 507 with each pass of the print head or hopper. The print head is bi-directional and will fuse material in both directions as the print head moves, so the powder hoppers operate behind the print head providing the buildup material to be fused on the next pass of the laser printing head.

By "addressable array" it is meant that one or more of: the power; duration of firing; sequence of firing; position of firing; the power of the beam; the shape of the beam spot, as well as, the focal length, e.g., depth of penetration in the z-direction, can be independently varied, controlled and predetermined or each laser beam in each fiber to provide precise and predetermined delivery patterns that can create from the target material highly precise end products (e.g., built materials) Embodiments of addressable arrays can also have the ability for individual beams and laser stops created by those beam to perform varied, predetermined and precise laser operations such as annealing, ablating, and melting.

Turning to FIG. 6 there is provided a schematic of an embodiment of a laser system with an addressable laser delivery configuration. The laser system can be a laser diode array system, a brightness converted system or a high power fiber laser system. The system has an addressable laser system 601. The system 601 provides independently addressable laser beams to a plurality of fibers 602a, 602b, 602c (greater and lower numbers of fibers and laser beams are contemplated). The fibers 602a, 602b, 602c are combined into a fiber bundle 604 that is contained in protective tube 603, or cover. The fibers 602a, 602b, 602c in fiber bundle 604 are fused together to form a printing head 605 that includes an optics assembly 606 that focuses and directs the laser beams, along beam paths, to a target material 607. The target material 607 can be annealed, to form an annealed material 609. The direction of movement of the laser head is shown by arrow 610.

Turning to FIG. 7 there is provided a schematic of an embodiment of a laser system with an addressable laser delivery configuration. The system has an addressable laser diode system 701. The system 701 provides independently addressable laser beams to a plurality of fibers 702a, 702b, 702c (greater and lower numbers of fibers and laser beams are contemplated). The fibers 702a, 702b, 702c are combined into a fiber bundle 704 that is contained in protective tube 703, or cover. The fibers 702a, 702b, 702c in fiber bundle 704 are fused together to form a printing head powder distribution head 720. The powder distribution head 720 can have the powder delivered coaxially with the laser beams, or transverse with the laser beams. The powder distribution head 720 provides a layer of additional material 709, which is fused to and on the top of the target material 707. The direction of movement of the laser head is shown by arrow 710.

Figure 8:
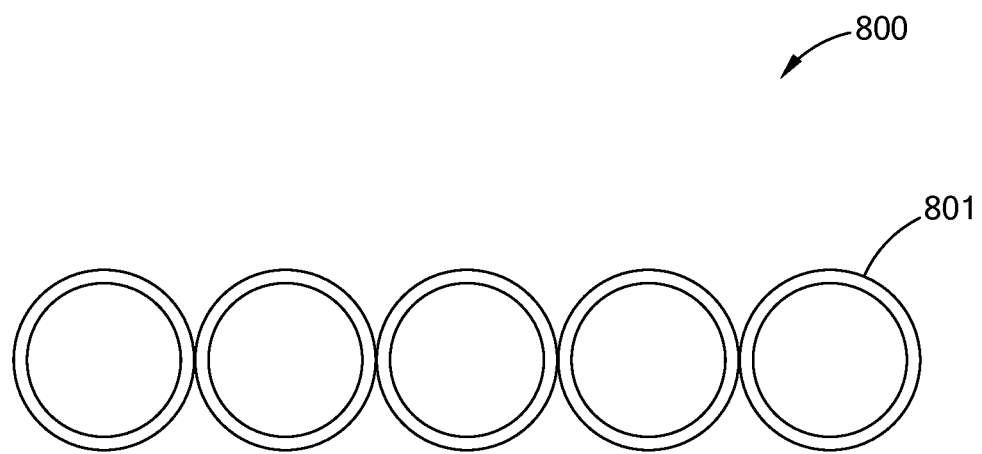
FIG. 8 is a schematic of an embodiment of a laser fiber bundle arrangement for use in an embodiment of a laser array system in accordance with the present inventions.

FIG. 8 shows a configuration of a bundle 800 of fibers, e.g., 801, that are fused together, and are used in the laser head of a system such as the systems shown in FIGS. 5-7. The configuration will deliver laser spots configured similarly to the fiber arrangement. In this embodiment, there are five fibers in a single linear row, a 1×5 linear configuration. A 1×n linear row of fibers is the ultimate laser printing head, where n is dependent on the physical extent of the product to be printed.

Figure 9:
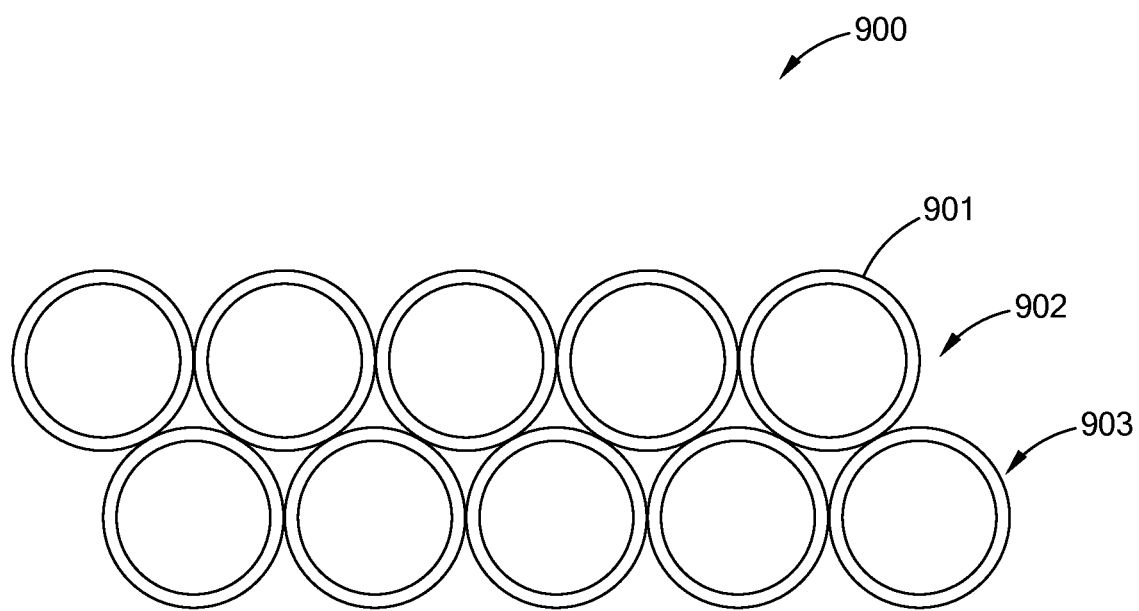
FIG. 9 is a schematic of an embodiment of a laser fiber bundle arrangement for use in an embodiment of a laser array system in accordance with the present inventions.

FIG. 9 shows a configuration of a bundle 900 of fibers, e.g., 901, that are fused together, and are used in the laser head of a system such as the systems shown in FIGS. 5-8. The configuration has two linear rows 902, 903 of fibers that are staggered and arranged in a rhomboid arrangement. The fibers will deliver laser spots configured similarly to the fiber arrangement. In this embodiment there are two rows of five fibers in each linear row, a 2×5 linear configuration.

Figure 10:
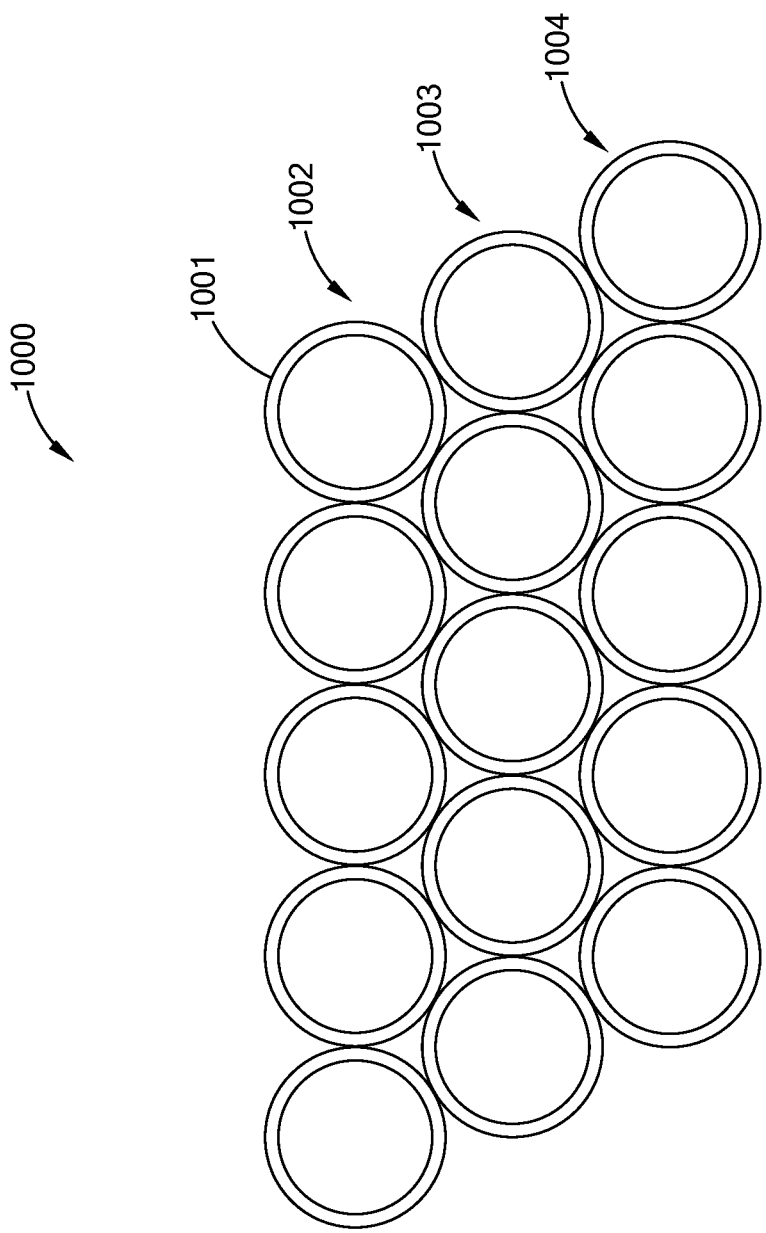
FIG. 10 is a schematic of an embodiment of a laser fiber bundle arrangement for use in an embodiment of a laser array system in accordance with the present inventions.

FIG. 10 shows a configuration of a bundle (1000) of fibers, e.g., 1001, that are fused together, and are used in a head of a system such as the systems shown in FIGS. 5-8. The configuration has three linear rows 1002, 1003, 1004 of fibers that are staggered and arranged in a rhomboid arrangement. The fibers will deliver laser spots configured similarly to the fiber arrangement. In this embodiment, there are three rows of five fibers in each linear row, a 3×5 linear configuration.

Figure 11:
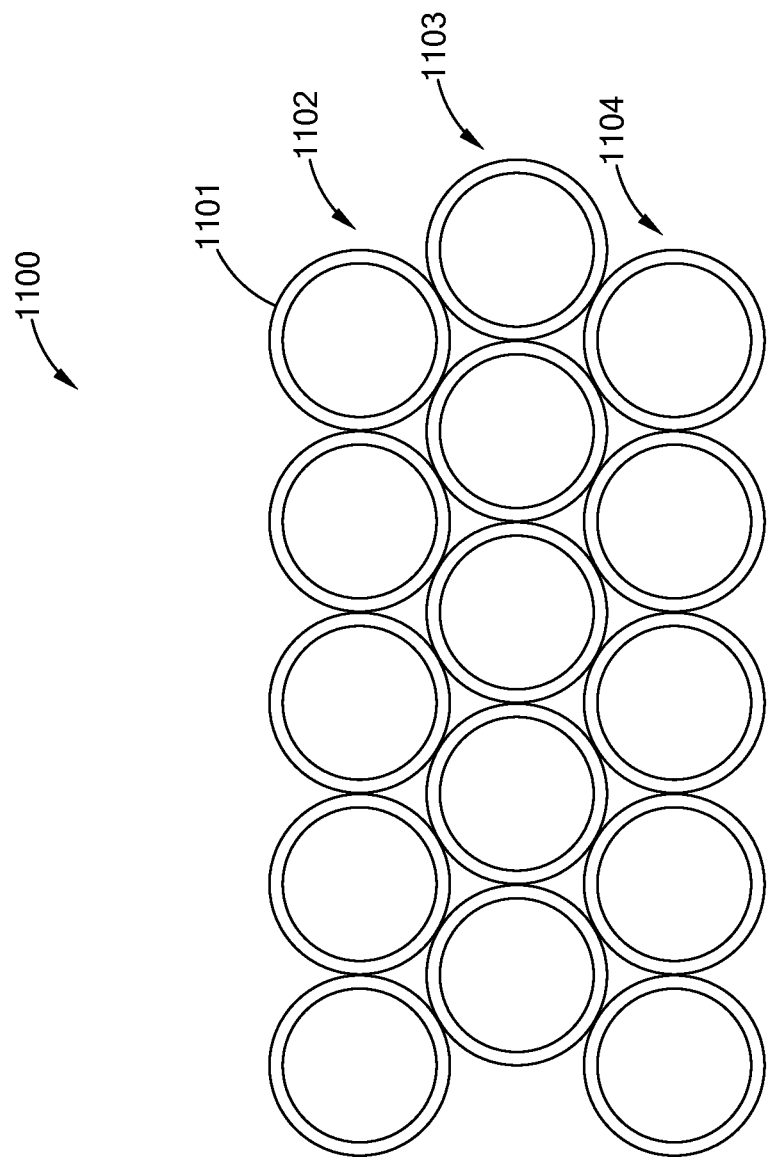
FIG. 11 is a schematic of an embodiment of a laser fiber bundle arrangement for use in an embodiment of a laser array system in accordance with the present inventions.

FIG. 11 shows a configuration of a bundle 1100 of fibers, e.g., 1101, that are fused together, and are used in a head of a system such as the systems shown in FIGS. 5-8. The configuration has three linear rows 1102, 1103, 1104 of fibers that are staggered and arranged in triangular arrangement. The fibers will deliver laser spots configured similarly to the fiber arrangement. In this embodiment, there are three rows of five fibers in each linear row, a 3×5 linear configuration.

Figure 12:
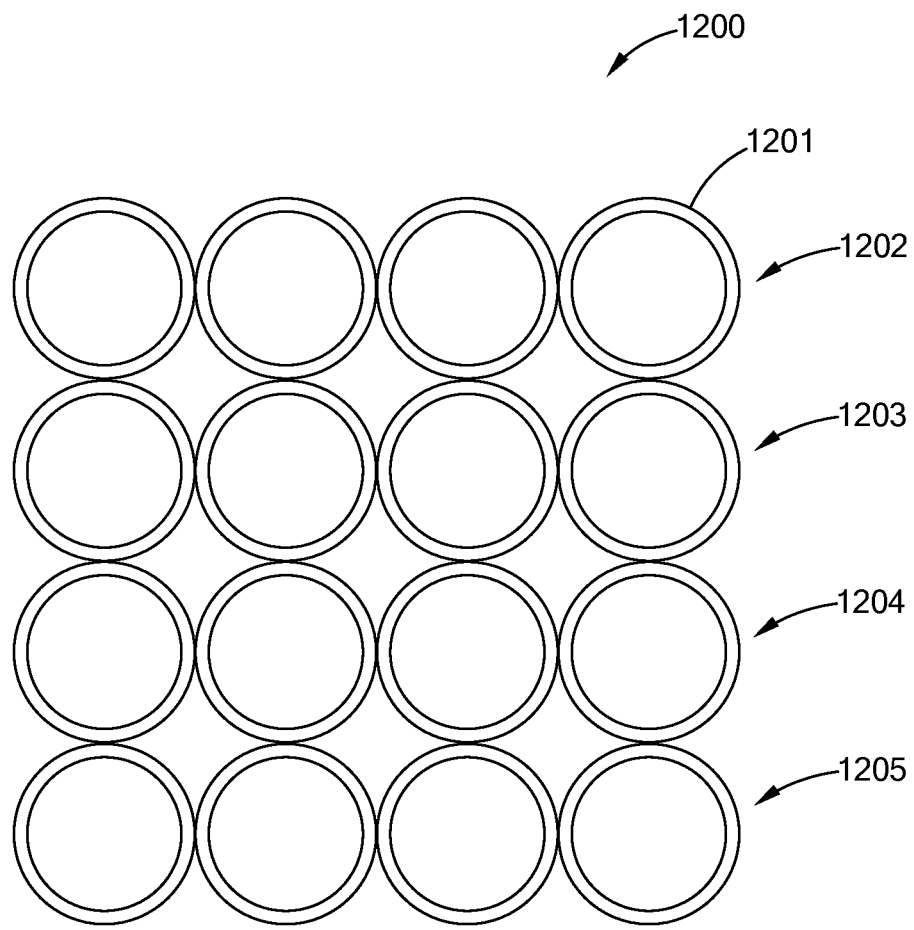
FIG. 12 is a schematic of an embodiment of a laser fiber bundle arrangement for use in an embodiment of a laser array system in accordance with the present inventions.

FIG. 12 shows a configuration of a bundle 1200 of fibers, e.g., 1201, that are fused together, and are used in a head of a system such as the systems shown in FIGS. 5-8. The configuration has four linear rows 1202, 1203, 1204, 1205 of fibers that are not staggered and arranged in a square arrangement. The fibers will deliver laser spots configured similarly to the fiber arrangement. In this embodiment, there are four rows of four fibers in each linear row, a 4×4 linear configuration.

Figure 13:
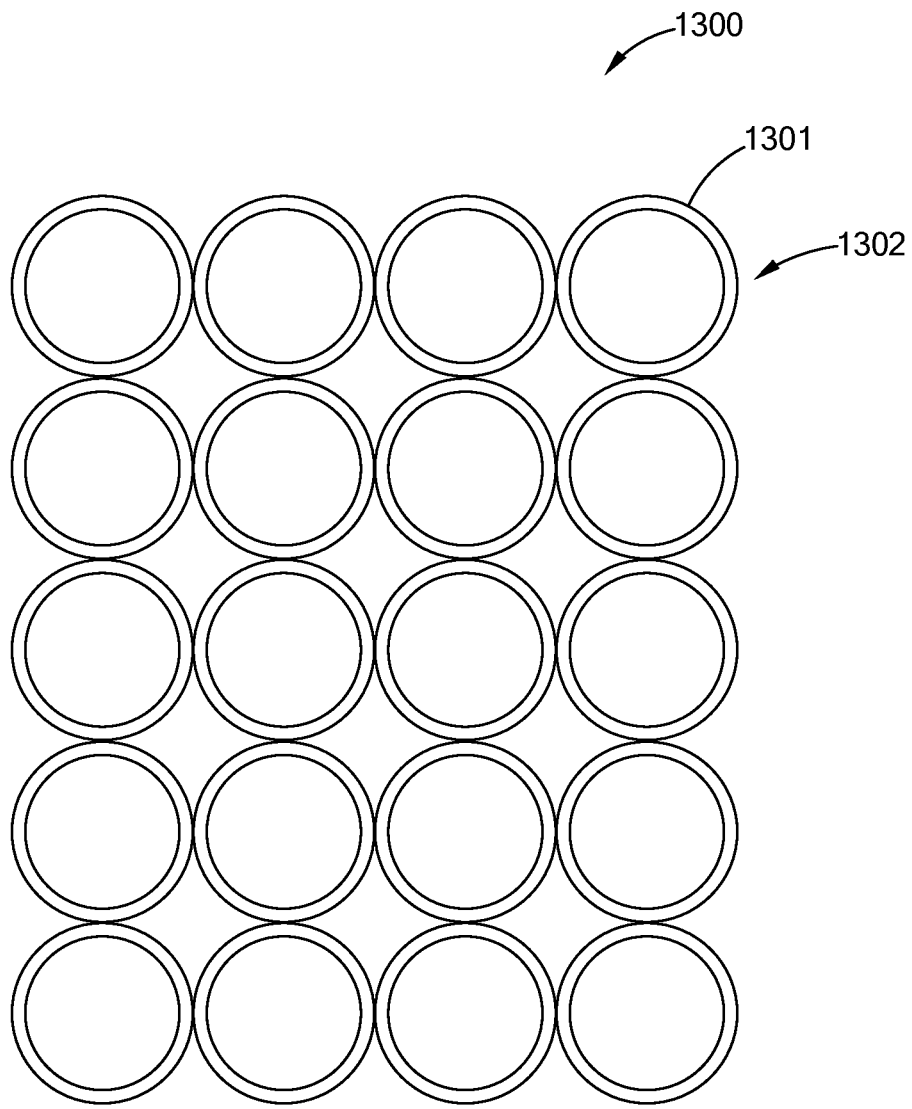
FIG. 13 is a schematic of an embodiment of a laser fiber bundle arrangement for use in an embodiment of a laser array system in accordance with the present inventions.

FIG. 13 shows a configuration of a bundle 1300 of fibers, e.g., 1301, that are fused together, and are used in a head of a system such as the systems shown in FIGS. 5-8. The configuration has five linear rows, e.g., 1302. The fibers are not staggered and are arranged in a square arrangement. The fibers will deliver laser spots configured similarly to the fiber arrangement. In this embodiment, there are five rows of four fibers in each linear row, a 5×4 linear configuration.

FIG. 14A shows a configuration of a bundle 1401 of five (n=5) fibers, e.g., 1401a arranged in a circular configuration.

FIG. 14B shows a configuration of a bundle 1402 of nine (n=9) fibers, e.g., 1402a arranged in a circular configuration having a fiber 1402b located in the center of the circle. The center fiber 1402b will be held in place or other fused by a media or holding device.

FIG. 14C shows a configuration of a bundle 1403 of nineteen (n=19) fibers, e.g., 1403a, that have an inner circle 1405 of fibers, and a center fiber 1403b.

Figure 15B:
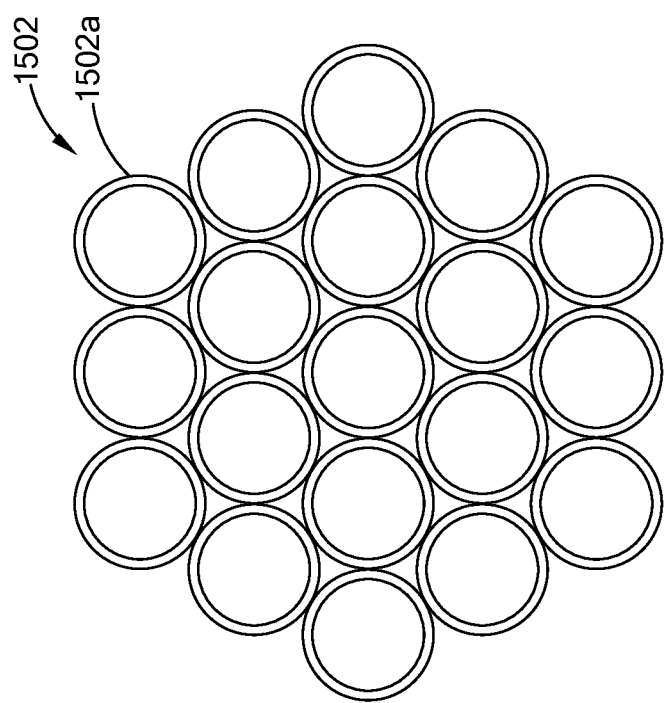
FIG. 15B is a schematic of an embodiment of a laser fiber bundle arrangement for use in an embodiment of a laser array system in accordance with the present inventions.
Figure 15A:
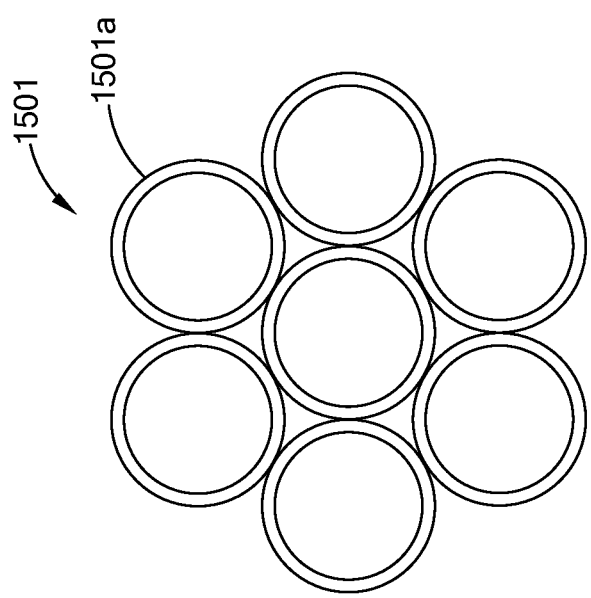
FIG. 15A is a schematic of an embodiment of a laser fiber bundle arrangement for use in an embodiment of a laser array system in accordance with the present inventions.

FIG. 15A shows a bundle 1501 of seven (n=7) fibers, e.g., 1501a that has a hexagonal arrangement with a triangular spacing.

FIG. 15B shows a bundle 1502 of nineteen (n=19) fibers, e.g., 1502a that has a hexagonal arrangement with a triangular spacing.

Figure 16D:
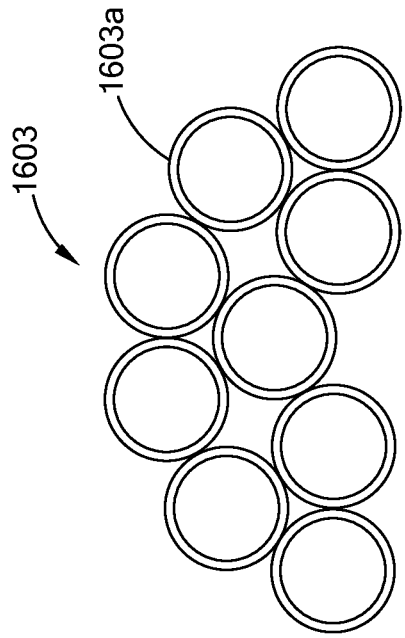
FIG. 16D is a schematic of an embodiment of a laser fiber bundle arrangement for use in an embodiment of a laser array system in accordance with the present inventions.
Figure 16C:
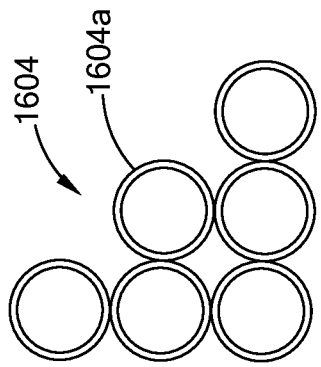
FIG. 16C is a schematic of an embodiment of a laser fiber bundle arrangement for use in an embodiment of a laser array system in accordance with the present inventions.
Figure 16B:
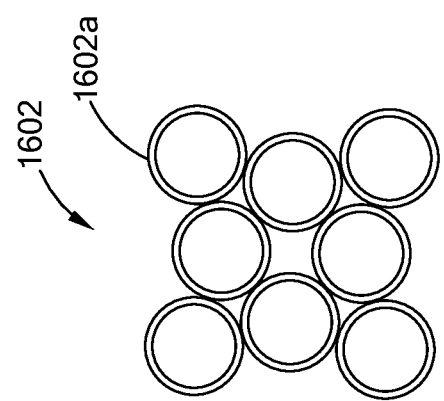
FIG. 16B is a schematic of an embodiment of a laser fiber bundle arrangement for use in an embodiment of a laser array system in accordance with the present inventions.
Figure 16A:
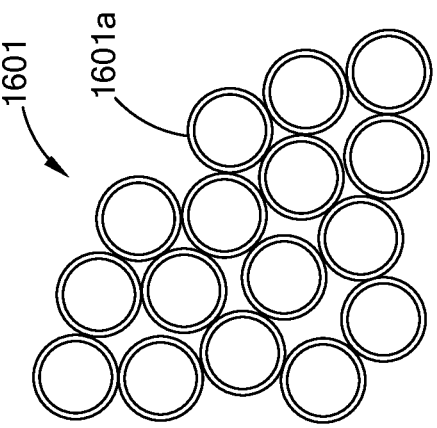
FIG. 16A is a schematic of an embodiment of a laser fiber bundle arrangement for use in an embodiment of a laser array system in accordance with the present inventions.

FIGS. 16A, 16B and 16C shows configurations of bundles of fibers that are arranged in arbitrary geometric arrangements. These configurations provide various levels of density of fibers in the configurations. FIG. 16A is an n=16 bundle 1601 of fibers, e.g., 1601a in a quarter circle configuration. FIG. 16B is an n=8 bundle 1602 of fibers, e.g., 1602b in a square configuration. FIG. 16C is an n=6 bundle 1604 of fibers, e.g., 1604a in a triangle configuration. FIG. 16D is an n=9 bundle 1603 of fibers, e.g., 1603a in a semicircle configuration.

The following examples are provided to illustrate various embodiments of laser arrays, systems, apparatus and methods of the present inventions. These examples are for illustrative purposes and should not be viewed as, and do not otherwise limit the scope of the present inventions.

Example 1

An array of blue laser diodes that are spatially combined to make a single spot in the far-field that can be coupled into a Solarization resistant optical fiber for delivery to the work piece.

Example 2

An array of blue laser diodes as described in Example 1 that are polarization beam combined to increase the effective brightness of the laser beam.

Example 3

An array of blue laser diodes with space between each of the collimated beams in the fast axis of the laser diodes that are then combined with a periodic plate which reflects the first laser diode(s) and transmits a second laser diode(s) to fill the space between the laser diodes in the fast direction of the first array.

Example 4

A patterned mirror on a glass substrate that is used to accomplish the space filling of Example 3.

Example 5

A patterned mirror on one side of the glass substrate to accomplish the space filling of Example 3 and the glass substrate is of sufficient thickness to shift the vertical position of each laser diode to fill the empty space between the individual laser diodes.

Example 6

A stepped heat sink that accomplishes the space filling of Example 3 and is a patterned mirror as described in Example 4.

Example 7

An array of blue laser diodes as described in Example 1 where each of the individual lasers are locked by an external cavity to a different wavelength to substantially increase the brightness of the array to the equivalent brightness of a single laser diode source.

Example 8

An array of blue laser diodes as described in Example 1 where individual arrays of laser diodes are locked to single wavelength using an external cavity based on a grating and each of the laser diode arrays are combined into a single beam using either narrowly spaced optical filters or gratings.

Example 9

An array of blue laser diodes as described in Example 1 that is used to pump a Raman convertor such as an optical fiber that has a pure fused silica core to create a higher brightness source and a fluorinated outer core to contain the blue pump light.

Example 10

An array of blue laser diodes as described in Example 1 that is used to pump a Raman convertor such as an optical fiber that has a $GeO_2$ doped central core with an outer core to create a higher brightness source and an outer core that is larger than the central core to contain the blue pump light.

Example 11

An array of blue laser diodes as described in Example 1 that is used to pump a Raman convertor such as an optical fiber that has a $P_2O_5$ doped core to create a higher brightness source and an outer core that is larger than the central core to contain the blue pump light.

Example 12

An array of blue laser diodes as described in Example 1 that is used to pump a Raman convertor such as an optical fiber that has a graded index core to create a higher brightness source and an outer core that is larger than the central core to contain the blue pump light.

Example 13

An array of blue laser diodes as described in Example 1 that is used to pump a Raman convertor fiber that is a graded index $GeO_2$ doped core and an outer step index core.

Example 14

An array of blue laser diodes as described in Example 1 that is used to pump a Raman convertor fiber that is a graded index $P_2O_5$ doped core and an outer step index core.

Example 15

An array of blue laser diodes as described in Example 1 that is used to pump a Raman convertor fiber that is a graded index $GeO_2$ doped core.

Example 16

An array of blue laser diodes as described in Example 1 that is used to pump a Raman convertor fiber that is a graded index $P_2O_5$ doped core and an outer step index core.

Example 17

Other embodiments and variations of the embodiment of Example one are contemplated. An array of blue laser diodes as described in Example 1 that is used to pump a Raman convertor such as diamond to create a higher brightness laser source. An array of blue laser diodes as described in Example 1 that is used to pump a Raman convertor such as KGW to create a higher brightness laser source. An array of blue laser diodes as described in Example 1 that is used to pump a Raman convertor such as $YVO_4$ to create a higher brightness laser source. An array of blue laser diodes as described in Example 1 that is used to pump a Raman convertor such as $Ba(NO_3)_2$ to create a higher brightness laser source. An array of blue laser diodes as described in Example 1 that is used to pump a Raman convertor that is a high pressure gas to create a higher brightness laser source. An array of blue laser diodes as described in Example 1 that is used to pump a rare-earth doped crystal to create a higher brightness laser source. An array of blue laser diodes as described in Example 1 that is used to pump a rare-earth doped fiber to create a higher brightness laser source. An array of blue laser diodes as described in Example 1 that is used to pump an outer core of a brightness convertor to create a higher ratio of brightness enhancement.

Example 18

An array of Raman converted lasers that are operated at individual wavelengths and combined to create a higher power source while preserving the spatial brightness of the original source.

Example 19

An Raman fiber with dual cores and a means to suppress the second order Raman signal in the high brightness central core using a filter, fiber Bragg grating, difference in V number for the first order and second order Raman signals or a difference in micro-bend losses.

Example 20

N laser diodes where $N \geq 1$ that can be individually turned on and off and can be imaged onto a bed of powder to melt and fuse the powder into a unique part.

Example 21

N laser diode arrays where $N \geq 1$ of Example 1 whose output can be fiber coupled and each fiber can be arranged in a linear or non-linear fashion to create an addressable array of high power laser beams that can be imaged or focused onto a powder to melt or fuse the powder into a unique shape layer by layer.

Example 22

One or more of the laser diode arrays combined via the Raman convertor whose output can be fiber coupled and each fiber can be arranged in a linear or non-linear fashion to create an addressable array of N where $N \geq 1$ high power laser beams that can be imaged or focused onto a powder to melt or fuse the powder into a unique shape layer by layer.

Example 23

An x-y motion system that can transport the N where $N \geq 1$ blue laser source across a powder bed while melting and fusing the powder bed with a powder delivery system positioned behind the laser source to provide a fresh powder layer behind the fused layer.

Example 24

A z-motion system that can increment/decrement the height of the part/powder bed of Example 20 after a new layer of powder is placed.

Example 25

A z-motion system can increment/decrement the height of the part/powder of Example 20 after the powder layer has been fused by the laser source.

Example 26

A bi-directional powder placement capability for Example 20 where the powder is placed directly behind the laser spot(s) as it travels in the positive x direction or the negative x direction.

Example 27

A bi-directional powder placement capability for Example 20 where the powder is placed directly behind the laser spot(s) as it travels in the positive y direction or the negative y direction.

Example 28

A powder feed system which is coaxial with N laser beams where N≥1.

Example 29

A powder feed system where the powder is gravity fed.

Example 30

A powder feed system where the powder is entrained in an inert gas flow.

Example 31

A powder feed system which is transverse to the N laser beams where N≥1 and the powder is placed by gravity just ahead of the laser beams.

Example 32

A powder feed system which is transverse to the N laser beams where N≥1 and the powder is entrained in an inert gas flow which intersects the laser beams.

Example 33

A second harmonic generation system which uses the output of the Raman convertor at for example 460 nm to generate light at half the wavelength of the source laser or 230 nm that consists of an externally resonant doubling crystal such as KTP but does not allow the short wavelength light to propagate through the optical fiber.

Example 34

A third harmonic generation system which uses the output of the Raman convertor at for example 460 nm to generate light at 115 nm using an externally resonant doubling crystal but does not allow the short wavelength light to propagate through the optical fiber.

Example 35

A fourth harmonic generation system which uses the output of the Raman convertor at for example 460 nm to generate light at 57.5 nm using an externally resonant doubling crystal but does not allow the short wavelength light to propagate through the optical fiber.

Example 36

A second harmonic generation system which uses the output of a rare-earth doped brightness convertor such as Thulium that lases at 473 nm when pumped by an array of blue laser diodes at 450 nm to generate light at half the wavelength of the source laser or 236.5 nm using an externally resonant doubling crystal but does not allow the short wavelength light to propagate through the optical fiber.

Example 37

A Third harmonic generation system which uses the output of a rare-earth doped brightness convertor such as Thulium that lases at 473 nm when pumped by an array of blue laser diodes at 450 nm to generate light at 118.25 nm using an externally resonant doubling crystal but does not allow the short wavelength light to propagate through the optical fiber.

Example 38

A fourth harmonic generation system which uses the output of a rare-earth doped brightness convertor such as Thulium that lases at 473 nm when pumped by an array of blue laser diodes at 450 nm to generate light at 59.1 nm using an externally resonant doubling crystal but does not allow the short wavelength light to propagate through the optical fiber.

Example 39

All other rare-earth doped fibers and crystals that can be pumped by a high power 450 nm source to generate visible, or near-visible output can be used in Examples 34-38.

Example 40

Launch of high power visible light into a non-circular outer core or clad to pump the inner core of either the Raman or rare-earth doped core fiber.

Example 41

Use of polarization maintaining fiber to enhance the gain of the Raman fiber by aligning the polarization of the pump with the polarization of the Raman oscillator.

Example 42

An array of blue laser diodes as described in Example 1 that is used to pump a Raman convertor such as an optical fiber that is structured to create a higher brightness source of a specific polarization.

Example 43

An array of blue laser diodes as described in Example 1 that is used to pump a Raman convertor such as an optical fiber that is structured to create a higher brightness source of a specific polarization and maintain the polarization state of the pump source.

Example 44

An array of blue laser diodes as described in Example 1 that is used to pump a Raman convertor such as an optical fiber to create a higher brightness source with a non-circular outer core structured to improve Raman conversion efficiency.

Example 45

The embodiments of Examples 1 to 44 may also include one or more of the following components or assemblies: a device for leveling the powder at the end of each pass prior to the laser being scanning over the powder bed; a device for scaling the output power of the laser by combining multiple low power laser modules via a fiber combiner to create a higher power output beam; a device for scaling the output power of the blue laser module by combing multiple low power laser modules via free space to create a higher power output beam; a device for combining multiple laser modules on a single baseplate with imbedded cooling.

It is noted that there is no requirement to provide or address the theory underlying the novel and groundbreaking performance or other beneficial features and properties that are the subject of, or associated with, embodiments of the present inventions. Nevertheless, various theories are provided in this specification to further advance the art in this important area, and in particular in the important area of lasers, laser processing and laser applications. These theories put forth in this specification, and unless expressly stated otherwise, in no way limit, restrict or narrow the scope of protection to be afforded the claimed inventions. These theories many not be required or practiced to utilize the present inventions. It is further understood that the present inventions may lead to new, and heretofore unknown theories to explain the operation, function and features of embodiments of the methods, articles, materials, devices and system of the present inventions; and such later developed theories shall not limit the scope of protection afforded the present inventions.

The various embodiments of lasers, diodes, arrays, modules, assemblies, activities and operations set forth in this specification may be used in the above identified fields and in various other fields. Additionally, these embodiments, for example, may be used with: existing lasers, additive manufacturing systems, operations and activities as well as other existing equipment; future lasers, additive manufacturing systems operations and activities; and such items that may be modified, in-part, based on the teachings of this specification. Further, the various embodiments set forth in this specification may be used with each other in different and various combinations. Thus, for example, the configurations provided in the various embodiments of this specification may be used with each other; and the scope of protection afforded the present inventions should not be limited to a particular embodiment, configuration or arrangement that is set forth in a particular embodiment, example, or in an embodiment in a particular Figure.

The invention may be embodied in other forms than those specifically disclosed herein without departing from its spirit or essential characteristics. The described embodiments are to be considered in all respects only as illustrative and not restrictive.

What is claimed:

1. An addressable array laser processing system, the addressable array laser processing system comprising: at least three laser systems, wherein each laser system comprises:
   a. at least three laser diode assemblies;
   b. each of the at least laser diode assemblies comprises at least ten laser diodes, wherein each of the at least ten laser diodes is capable of producing a blue laser beam, having a power of at least about 2 Watts and a beam parameter product of less than 8 mm-mrad, along a laser beam path, wherein each laser beam path is essentially parallel, whereby a space is defined between the laser beams traveling along the laser beam paths; and
   c. a means for spatially combining and preserving brightness of the blue laser beams positioned on all of the at least thirty laser beam paths, the means for spatially combining and preserving brightness comprising a collimating optic for a first axis of a laser beam, a vertical prism array for a second axis of the laser beam, and a telescope; whereby the means for spatially combining and preserving fills in the space between the laser beams with laser energy, thereby providing a combined laser beam a power of at least about 250 Watts, and a beam parameter product of less than 40 mm-mrad;
   each of the at least three laser systems configured to couple each of their combined laser beams into a single optical fiber; whereby each of the at least the three combined laser beams being capable of being transmitted along its coupled optical fiber; the at least three optical fibers in optical association with a laser head; and a control system; wherein the control system comprises a program having a predetermined sequence for delivering each of the combined laser beams at a predetermined position on a target material.

2. The addressable array of claim 1, wherein the predetermined sequence for delivering comprises individually turning on and off the laser beams from the laser head, thereby imaging onto a bed of powder to melt and fuse the target material comprising a powder into a part.

3. The addressable array of claim 1, wherein the fibers in the laser head are configured in an arrangement selected from the group consisting of linear, non-linear, circular, rhomboid, square, triangular, and hexagonal.

4. The addressable array of claim 1, wherein the fibers in the laser head are configured in an arrangement selected from the group consisting of 2×5, 5×2, 4×5, at least 5× at least 5, 10×5, 5×10 and 3×4.

5. The addressable array of claim 1, wherein the target material comprises a powder bed; and, comprising: an x-y motion system, capable of transporting the laser head across a powder bed, thereby melting and fusing the powder bed; and a powder delivery system positioned behind the laser source to provide a fresh powder layer behind the fused layer.

6. The addressable array of claim 5, comprising: a z-motion system, capable of transporting the laser head to increment and decrement a height of the laser head above a surface of the powder bed.

7. The addressable array of claim 5, comprising: a bi-directional powder placement device capable of placing powder directly behind the delivered laser beam as it travels in a positive x direction or a negative x direction.

8. The addressable array of claim 5, comprising a powder feed system that is coaxial with a plurality of laser beam paths.

9. The addressable array of claim 5, comprising a gravity feed powder system.

10. The addressable array of claim 5, comprising a powder feed system, wherein the powder is entrained in an inert gas flow.

11. The addressable array of claim 5, comprising a powder feed system that is transverse to N laser beams where N≥1 and the powder is placed by gravity ahead of the laser beams.

12. The addressable array of claim 5, comprising a powder feed system that is transverse to N laser beams where N≥1 and the powder is entrained in an inert gas flow which intersects the laser beams.

* * * * *